US008176641B2

(12) United States Patent
Mithal et al.

(10) Patent No.: US 8,176,641 B2
(45) Date of Patent: May 15, 2012

(54) METALLIZED CUTLERY AND TABLEWARE AND METHOD THEREFOR

(75) Inventors: Ashish K Mithal, North Chelmsford, MA (US); David Gordon, Groton, MA (US); Thomas E Ellsworth, Wilmington, MA (US); Raymond Chen, Framingham, MA (US); William A Gallop, Westminster, MA (US)

(73) Assignee: Waddington North America, Inc., Chelmsford, MA (US)

( * ) Notice: Subject to any disclaimer, the term of this patent is extended or adjusted under 35 U.S.C. 154(b) by 0 days.

(21) Appl. No.: 12/757,303

(22) Filed: Apr. 9, 2010

(65) Prior Publication Data

US 2010/0192388 A1 Aug. 5, 2010

Related U.S. Application Data

(63) Continuation of application No. 11/123,409, filed on May 6, 2005, now abandoned, which is a continuation-in-part of application No. 10/228,147, filed on Aug. 26, 2002, now Pat. No. 6,983,542.

(60) Provisional application No. 60/314,677, filed on Aug. 24, 2001.

(51) Int. Cl.
*A47J 43/28* (2006.01)
(52) U.S. Cl. ............................ 30/322; 30/324
(58) Field of Classification Search ............... 30/322, 30/324, 340, 142–150
See application file for complete search history.

(56) References Cited

U.S. PATENT DOCUMENTS

| 432,991 A | 7/1890 | Eggleston |
| 3,136,416 A | 6/1964 | Goldrosen |
| 3,146,770 A | 9/1964 | Garcea |
| 3,445,350 A | 5/1969 | Klinger et al. |
| 3,607,350 A | 9/1971 | Rathsack |
| 3,629,922 A | 12/1971 | Miller |
| 3,677,821 A | 7/1972 | Miller |
| 3,769,056 A | 10/1973 | Sincock |
| 3,896,252 A | 7/1975 | Tuttle |
| 3,926,792 A | 12/1975 | Buford |

(Continued)

FOREIGN PATENT DOCUMENTS

CA 2458486 C 11/2008

(Continued)

OTHER PUBLICATIONS

"Introducing the Classy Collection", Spir-it, Inc., Wakefield MA, not later than 1997-2000.

(Continued)

*Primary Examiner* — Boyer D Ashley
*Assistant Examiner* — Omar Flores Sanchez
(74) *Attorney, Agent, or Firm* — Maine Cernota & Rardin

(57) ABSTRACT

A plastic cutlery item molded from a plastic material, such as polystyrene, having a metallic coating that imparts to this cutlery item the appearance of metal cutlery or silverware. In one embodiment the plastic cutlery or tableware items are molded using injection molding techniques, and subjected to a vacuum metallizing process in an individualized non-contiguous manner, where a thin metallic layer is deposited on at least one of their surfaces. The resultant items simulate the appearance of metal cutlery or tableware. In one embodiment of the invention the plastic cutlery or tableware articles are molded from a clear polystyrene resin and are coated with a thin stainless steel layer through vacuum sputtering deposition on only one of the sides. The abrasion resistance of the metallic coating can be enhanced by subjecting the articles to a post-metallizing holding period or by applying a clear protective overcoat.

39 Claims, 8 Drawing Sheets

U.S. PATENT DOCUMENTS

| | | | |
|---|---|---|---|
| 3,939,834 | A | 2/1976 | McMahon |
| 3,962,494 | A | 6/1976 | Nuzzi |
| 4,009,995 | A | 3/1977 | Dressler |
| 4,039,714 | A | 8/1977 | Roubal et al. |
| 4,073,743 | A | 2/1978 | Midler, Jr. et al. |
| 4,115,619 | A | 9/1978 | Kurfman et al. |
| 4,195,117 | A | 3/1980 | Luch |
| 4,362,253 | A | 12/1982 | Wortley et al. |
| 4,367,138 | A | 1/1983 | Kustas |
| 4,461,895 | A | 7/1984 | Fritschi et al. |
| 4,524,512 | A | 6/1985 | Formo et al. |
| 4,610,895 | A | 9/1986 | Tubergen et al. |
| 4,632,253 | A | 12/1986 | Stromgren et al. |
| 4,678,690 | A | 7/1987 | Palmer et al. |
| 4,707,922 | A | 11/1987 | Hosak-Robb |
| 4,803,094 | A | 2/1989 | Myers |
| 4,810,333 | A | 3/1989 | Gulla et al. |
| 4,825,025 | A | 4/1989 | Seiferth |
| 5,022,554 | A | 6/1991 | Heeter et al. |
| 5,177,124 | A | 1/1993 | Questel et al. |
| 5,280,052 | A | 1/1994 | Questel et al. |
| 5,378,735 | A | 1/1995 | Hosokawa et al. |
| 5,750,242 | A | 5/1998 | Culler |
| 5,753,349 | A | 5/1998 | Boswell |
| 5,782,346 | A | 7/1998 | Gray et al. |
| 6,074,740 | A | 6/2000 | Scheckenbach et al. |
| 6,145,204 | A | 11/2000 | Cash |
| 6,322,859 | B1 | 11/2001 | Pluim et al. |
| 6,524,694 | B1 | 2/2003 | Phillips |
| 6,676,810 | B2 | 1/2004 | Parent |
| 6,893,542 | B1 | 5/2005 | Chen |
| 6,983,542 | B2 | 1/2006 | Mithal et al. |
| 2003/0031891 | A1 | 2/2003 | Fields |
| 2003/0213432 | A1 | 11/2003 | Parent |
| 2006/0191145 | A1 | 8/2006 | Mithal et al. |

FOREIGN PATENT DOCUMENTS

| | | |
|---|---|---|
| CN | 1323812 C | 7/2007 |
| EP | 1427573 B1 | 6/2006 |
| EP | 1955620 | 8/2008 |
| JP | 57005870 | 1/1982 |
| WO | 03018270 | 3/2003 |

OTHER PUBLICATIONS

"Simply Cookware," Cookware Materials—Properties, Care & Use, http://www.simplycookware.com/cookware-materials.html, Nov. 5, 2007.

"The Classy Collection is a Standout", Spir-it, Inc./ Oak Hill, Wakefield MA, not later than 1999-2000.

"The Classy Collection Plated Spoons, Forks, Knives, and Classy Picks", at least as early as Aug. 24, 2000, pp. 1-8, Oak Hill by Spir-it, MA.

Appeal of Administrative Written Judgment of Beijing No. 1 Intermediate Peoples' Court of the People's Republic of China, Judgement No. 117 maintaining invalidation decision and English translation—dated Sep. 3, 2009, 15 pages.

Canadian Intellectual Property Office Office Action for Waddington North America, Inc. application No. 2,458,486, dated Oct. 24, 2007.

China Intellectual Property Office Judgement No. 117 for Legal Proceedings to the Invalidation Decision for Patent 02820864.1(and English translation), dated Jul. 30, 2009, 53 pages (WNA11-China & Exhibit 13 frm NL Litigation).

China Intellectual Property Office Notification of Acceptance of Request for Invalidation of Waddington North America, Inc. Patent No. 02820864.1, dated Oct. 8, 2007.

China Intellectual Property Office Notification of Second Office Action for Chinese Patent Application 200710097375.4 (and English translation), dated May 15, 2009, 37 pages.

China Office Action dated Mar. 24, 2006 of China Patent Application No. 02820864.1, 10 pages.

China Office Action dated Sep. 29, 2006 of China Patent Application No. 02820864.1, 9 pages.

China Office Action Response and English translation, dated Jul. 19, 2006 of China Patent Application No. 02820864.1, 14 pages.

Chinese Office Action dated Aug. 8, 2008 for Patent Application No. 200710097375.4, 12 pages.

District Court of the Hague, "Judgement in Preliminary Relief Proceedings," (Sep. 18, 2009), in the case of *Caterware B.V. (a licensee of Waddington North America, Inc.)* v. *Sabert Corp. Europe S.A.*, et al., 19 pages.

Document entitled "Notarization No. 19726-2007" with attachments and translation.

EP 1955620 Third Party Observations According to Art. 115 EPC, dated Mar. 12, 2009, submitted by Gevers & Vander Haeghen SA to European Patent Office, 10 pages.

European Examination Report dated Sep. 23, 2005 for European Patent Application No. EP 02 76 3539.0 filed Aug. 26, 2002, 3 pages.

European Observation Report dated Jan. 8, 2007 of European Patent Application No. 02763539.0-2313, 8 pages.

European Office Action dated Aug. 24, 2006 of European Patent Application No. 02763539.0-2313, 4 pages.

European Office Action dated Feb. 21, 2005 of European Patent Application No. 02763539.0-2313, 3 pages.

European Office Action dated Nov. 23, 2004 of European Patent Application No. 02763539.0-2313, 3 pages.

European Office Action dated Sep. 23, 2005 of European Patent Application No. 02763539.0-2313, 3 pages.

European Office Action Response dated Feb. 3, 2005 of European Patent Application No. 02763539.0-2313, 10 pages.

European Office Action Response dated Jul. 20, 2006 of European Patent Application No. 02763539.0-2313, 8 pages.

European Office Action Response dated Sep. 2, 2005 of European Patent Application No. 02763539.0-2313, 5 pages.

European Patent Office Examination Report dated Jan. 15, 2009 for Application No. 08 155 243.2, 2 pages.

European Patent Office Notice of Intent to Grant application No. EP 02763539.0 for Waddington North America, Inc. dated Nov. 5, 2007, 36 pages.

European Search Report dated Aug. 17, 2004 of European Patent Application No. EP 02 76 3539.0 filed Aug. 26, 2002, 3 pages.

European Search Report dated Jun. 30, 2008 of European No. EP Application No. EP 08 15 5243 filed Apr. 25, 2008.

Frank Bergin, Correspondence to Philippe Leemans, Aug. 17, 2009, 1 page.

The Patent Reexamination Board of the State Intellectual Property Office of P.R. China, Decision of Request for Invalidation of Chinese Patent 02820864.1 (and English translation), dated Aug. 28, 20, 13 pages.

China Intellectual Property Office, Decision No. 12154, Boards Decision on the Invalidation Request for Patent 02820864.1 dated Aug. 25, 2008, 22 pages.

China Intellectual Property Office Judgement No. 117 for Administrative Judgement of Beijing No. 1 Intermediate People's Court of the People's Republic of China, for Patent 02820864.1 (and English translation) Jul. 30, 2009, 50 pages.

US Office Action for Reexam case 90/008,337 dated Sep. 26, 2008, 21 pages.

Gielen, Jacques, Huissiers de Justice, Citation ref. Sabert/Waddington North America, 22 pages dated Aug. 19, 2008.

Vergason, G. et al, "Selection of Materials and Techniques for Performance Coatings", Society of Vacuum Centers, 1999, pp. 53-57.

Vereenigde correspondence with Sabert Corp.—Europe, dated Jul. 15, 2008, 1 page.

Vereenige correspondence to Depa Disposables B.V. dated Nov. 13, 2008 regarding EP 1427573 B1, 3 pgs.

CaterBrands correspondence with Remmerco Limited dated Jan. 27, 2009 regarding EP Patent No. 1427573, 6 pages.

Email correspondence from Jooo Meerbeek to Wijst, Jos vd dated Nov. 13, 2008, 1 pg.

"Thickness Determination of a Metalized Coating on a Plastic Knife" by Alliance Technologies, LLC. Prepared for Sabert Corp., 5 pages, May 21, 2008.

Leidsegracht Advocaten, Correspondence to Vereenigde & Caterbands, Nov. 21, 2008, 4 pages.

Sabert's Sep. 1, 2009 submission—Leidsegracht Advocaten Correspondence to Vereenigde & Caterbands dated Feb. 3, 2009, 11 pgs.

Sabert's Sep. 1, 2009 submission—Kneppelhout & Korthals N.V. Correspondence to Bergh Stoop & Co. dated Jul. 31, 2009, 2 pgs.
Sabert's Sep. 1, 2009 submission—Email correspondence between Leen Paardekooper and Fred Langerak, dated between Dec. 29, 2008 and Dec. 30, 2008, 5 pgs.
Sabert's Sep. 1, 2009 submission—US Reexam Control No. 90/008,337, Notice of Intent to Issue Ex Parte Reexamination Certificate dated Jun. 26, 2009, 1 pg.
US Reexam Control No. 90/008,337, Status of Claims and Support for Claim Changes Accompanying Statement by Patent Owner in Ex Parte Reexamination, Submitted by Maine & Asmus dated Feb. 8, 2007, 14 pgs.
Sabert's Sep. 1, 2009 submission—"SEM Characterization of Metallized Coatings on Plasticware" by Alliance Technologies LLC, Prepared for Sabert Corp., 6 pages, Aug. 17, 2009.
Sabert's Sep. 1, 2009 submission—Alliance Technologies, LLC [online] [retrieved on Aug. 14, 2009] from <URL:http://www.alliancetechgroup.com/>, 4 pages.
Sabert's Sep. 1, 2009 submission—Gevers & Vander Haeghen, Statement of Facts and Grounds, 20 pages.
Sabert's Sep. 1, 2009 submission—Gevers & Vander Haeghen, Additional Statement of Facts and Grounds, 10 pages.
Sabert's Sep. 1, 2009 submission—Brigitte Van Horenbeeck provided search from wayback machine <URL:http://www.spir-it.com/oak_cutlery.html>, Dec. 12, 2006, 9 pgs.
Ezra Sutton & Associates, P.A., Protest Under 37 C.F.R. Sect 1.29(a) against U.S. Appl. No. 11/123,409, filed Nov. 5, 2009, 41 pages.
Ezra Sutton Esq., "Certificate of Service", United States District Court, District of New Jersey, Case No. 06-5423, Jan. 17, 2007, 1 page.
Ezra Sutton, Esq., Correspondence to Michael Evans, Waddington North America, Inc., Aug. 8, 2006, 3 pages.
Ezra Sutton, Esq., Correspondence to Scott Asmus, Maine & Asmus PLLC, Sep. 19, 2006, 1 page.
Ezra Sutton, Esq, Correspondence to Scott Asmus, Maine & Asmus PLLC, Nov. 6, 2006, 2 pages.
Hillestad, Keith, "Plastics decorating technology provides many processing options", Modern Plastics, Nov. 1998, pp. F-7-F-8, United Silicone Inc.
http://www.merriam-webster.com/dictionary/metallized.
http://www.merriam-webster.com/dictionary/plating.
http:/www.steel.org/AM/Template.cfm?Section=Steel_Glossary2&TEMP, 3 pgs.
Invoice to Sensational Celebration, Invoice No. 232061, Jun. 19, 1997, 1 page.
Invoice to State News, Invoice No. 268949, Nov. 24, 1999, 1 page.
Kirkland, Carl, "Sputtered single-use silverware", http://www.immnet.com/articles?article=2907, Sep. 24, 2007, 4 pages.
Lerner David Littenberg Krumholz & Mentlik LLP, Correspondence from Alston & Bird LLP, attorney for Richard Penley, Penley Corporation, Jan. 11, 2008, 2 pages.
Lerner David Littenberg Krumholz & Mentlik LLP, Correspondence to Richard Penley, Penley Corporation, Jan. 4, 2008, 3 pages.
Maine & Asmus, Correspondence from Ezra Sutton, Esq., Ezra Sutton P.A., Oct. 30, 2007, 1 page.
Maine & Asmus, Correspondence to Ezra Sutton, Esq., Ezra Sutton P.A., Aug. 21, 2006, 2 pages.
Maine & Asmus, Correspondence to Ezra Sutton, Esq., Ezra Sutton P.A., Oct. 12, 2006, 2 pages.
Maine & Asmus, Correspondence to Ezra Sutton, Esq., Ezra Sutton P.A., Sep. 25, 2006, 1 page.
Metallurgical Engineering Services, Inc., "Report of: composition and Thickness Analyses of [Spir-it] Metallized Plastic Fork," (Sep. 1, 2006), 6 pages.
Muccio, E., "Decoration and Assembly of Plastic Parts", pp. iv-ix and Chapter 7 and Chinese translation thereof, 1999.
Oak hill cutlery—'Oak Hill's line of plasticware puts a fine shine on all holiday celebrations', dated May 19, 2000, internet extract: http://web.archive.org/web/20000519093414/h ttp://www.spir-it.com/oak_cutlery.html XP003004325.
PCT International Search Report dated Dec. 19, 2002 of International Application No. PCT/US02/27232 filed Aug. 26, 2002, 1 page.

Polyhedron Laboratories, Inc., "Analytical Report of [Spir-it] 'Gold' Spoon." (Oct. 13, 2006), 6 pages.
R. Allen Myers, "An Introduction to Funtional Thim Films," presented at the Society of Plastics Engineer's EMI/RFI Symposium, pp. 1-7, (Jun. 1987).
Richard Sugerman, President of Providence Metallizing, and Charles Gadon, Vice President of Operations of Providence Metallizing, sworn affidavit entitled"Providence Metallizing—History of Metallizing," (Oct. 3, 2007), pp. 1-3.
Sabert Corporation Europe Summons Before The High Court of Paris against French Patent No. EP 1427573 B1, dated Jun. 12, 2009, 23 pages.
*Sabert Corporation* vs. *Waddington North America, Inc.* (WNA), "Complaint", United States District Court, District of New Jersey, Case No. 06-5423, Nov. 10, 2006, 8 pages.
*Sabert Corporation* vs. *Waddington North America, Inc.* (WNA), "Declaration of Darryl Nazareth in Opposition to WNA's Motion to Dismiss or Stay Litigation Pending Conclusion of Re-Examination Proceedings in the Patent Office", United States District Court, District of New Jersey, Case No. 06-5423 (JAG Jr.), Feb. 12, 2007, 5 pages.
*Sabert Corporation* vs. *Waddington North America, Inc.* (WNA), "Declaration of Roy H. Wepner", United States District Court, District of New Jersey, Case No. 06-5423, Jan. 17, 2007, 2 pages.
*Sabert Corporation* vs. *Waddington North America, Inc.* (WNA), "Memorandum of Defendant Waddington North America, Inc. In Support of its Motion to Dismiss or, in the Alternative, to Stay or Administratively Terminate Pending Outcome of Reexamination", United States District Court, District of New Jersey, Case No. 06-5423, Jan. 17, 2007, 32 pages.
*Sabert Corporation* vs. *Waddington North America, Inc.* (WNA), "Notice of Motion and Motion to Dismiss or, in the Alternative, to Stay or Administratively Terminate Pending Outcome of Reexamination", United States District Court, District of New Jersey, Case No. 06-5423, Jan. 17, 2007, 3 pages.
*Sabert Corporation* vs. *Waddington North America, Inc.* (WNA), "Reply Memorandum of Defendant Waddington North America, Inc. In Support of its Motion to Dismiss or, in the Alternative, to Stay or Administratively Terminate Pending Outcome of Reexamination", United States District Court, District of New Jersey, Case No. 06-5423 (JAG Jr.)(MCA), Feb. 20, 2007, 18 pages.
*Sabert Corporation* vs. *Waddington North America, Inc.* (WNA), "Sabert's Opposition to WNA's Motion to Dismiss or Stay Litigation Pending Conclusion of Re-Examination Proceedings in the Patent Office", United States District Court, District of New Jersey, Case No. 06-5423 (JAG Jr.), Feb. 12, 2007, 16 pages.
*Sabert Corporation* vs. *Waddington North America, Inc.* (WNA), "Second Declaration of Roy H. Wepner", United States District Court, District of New Jersey, Case No. 06-5423 (JAG Jr.)(MCA), Feb. 20, 2007, 43 pages.
*Sabert Corporation* vs. *Waddington North America, Inc.*, "Certification Under Local Rule 11.2", United States District Court, District of New Jersey, Case No. 06-5423, Jan. 17, 2001, 1 page.
*Sabert Corporation* vs. *Waddington North America, Inc.*, "Proposed Order", United States District Court, District of New Jersey, Case No. 06-5423, Jan. 17, 2007, 1 page.
*Sabert* v. *Waddington North America, Inc.*, "Sutton to Court Sandisk", United States Federal Court, Case No. 2:06-cv-05423-JAG-MCA, Document 13, 3 pages.
Statement from Automated Vacuum Systems—Metallizing Activities, Aug. 8, 2006, 2 pages.
Statement from Providence Metallizing—History of Metallizing, Jun. 27, 2006, 3 pages.
Statement of Mariangeli Santana—Spirit Brands—Activities in Metallized Cutlery, Jul. 28, 2006, 2 pages.
Statement of Donald M. Mattox, Sep. 27, 2007, 4 pages.
Vacuum Coating Technology and the growth of the Society of Vacuum Coaters, copyright 2007 Society of Vacuum Coaters, Donald M. Mattox; Chapter 5, "Vacuum Coating Technology and Optical Storage Media," by John Marcantonio.
WNA, Inc., Letter to Customer, Nov. 6, 2009, 2 pages.
Sutton, Ezra for Sabert Corporation, Sabert's Answer, Affirmative Defenses, and Six Counterclaims, Dec. 1, 2009, 69 pages.

Sutton, Ezra for Sabert Corporation, Sabert's First Amended Answer, Affirmative Defenses, and Seven Counterclaims, Dec. 17, 2009, 87 pages.
Lerner David Littenberg Krumholz & Mentlik, LLP, WNA 6.0-001 *Sabert Corp. v. Waddington North America, Inc.* Civil Action No. 06-5423-JAG,Jr.-MLC, Letter to Judge Joseph A. Greenaway, Jr., Sep. 23, 2009, 6 pages.
Lerner David Littenberg Krumholz & Mentlik, LLP, *Sabert Corp. v. Waddington North America, Inc.* Civil Action No. 06-5423-JAG,Jr.-MCA Final Judgement Order, Sep. 23, 2009, 2 pages.
Lerner David Littenberg Krumholz & Mentlik, LLP, Waddington North America, Inc. Sabert Corporation Civil Action No., Complaint for Patent Infringement and Demand for Trial by Jury, Sep. 23, 2009, 8 pages.
Rule 132 Declaration of Michael G. Evans, Oct. 13, 2004, 8 pages.
Rule 132 Declaration of David Gordon, Oct. 18, 2004, 3 pages.
Rule 132 Declaration of Albert F. Madonna, Oct. 1, 2004, 24 pages.
Rule 132 Declaration of Ashish K. Mithal, Oct. 13, 2004, 20 pages.
Second Declaration of Michael G. Evans, Aug. 6, 2007, 4 pages.
Declaration of Albert F. Madonna, Oct. 17, 2006, 2 pages.
Second Declaration of Ashish K. Mithal, Analysis of Old Spirit Cutlery, Aug. 3, 2007, 4 pages.
Third Declaration of Albert F. Madonna, Aug. 6, 2007, 9 pages.
Third Declaration of Ashish K. Mithal, Aug. 6, 2007, 12 pages.
Fourth Declaration of Albert F. Madonna, Nov. 26, 2007, 4 pages.
Fourth Declaration of Ashish K. Mithal, including Exhibit AKM-8, AKM-9, AKM-10, Nov. 25, 2008, 15 pages.
Schwartz, Mel, Excerpt from Encyclopedia of Materials, Parts, and Finishes, 2nd Edition, 2002, 2 pages, Boca Raton, FL.
Statement from Automated Vacuum Systems, Sep. 28, 2007, 2 pages.
Statement of Mariangeli Santana—Spirit—Activities in Metallized Cutlery, Oct. 3, 2007, 3 pages.
Spirit Brands, Correspondence from Donald C. McCann of Spirit Brands to Albert Salama of Sabert Corporation, Apr. 24, 2006, 4 pages.
Chinese Office Action dated Feb. 25, 2010 of Chinese Patent Application No. 200710097375.4, 20 pages. English Translation.
Midwest Tungsten Service, Inc., "Tips: Second Surface,"(2003), http://www.tungsten.com/2ndsurface.pdf, 2 pages.
*Waddington North America, Inc v. Sabert Corporation*, Civil Action No. 09-4883-GEB-MCA, Final Judgement on Consent, Sep. 20, 2011, 2 pages.
WNA, Inc., General Notice, Sep. 13, 2011, 1 page.
*Waddington North America, Inc v. Sabert Corporation*, Civil Action No. 09-4883-JAG-MCA, Sabert's Answer and Exhibits, Document 13, Dec. 1, 2009, 120 pages.
*Waddington North America, Inc v. Sabert Corporation*, Civil Action No. 09-4883-JAG-MCA, Sabert's First Amended Answer and Exhibits, Document 18, Dec. 17, 2009, 146 pages.
*Waddington North America, Inc v. Sabert Corporation*, Civil Action No. 09-4883-JAG-MCA, WNA Brief in Support of Dismissal, Document 20-1, Dec. 23, 2009, 30 pages.
*Waddington North America, Inc v. Sabert Corporation*, Civil Action No. 09-4883-JAG-MCA, Sabert's Memorandum and Exhibits, Document 32, Jan. 10, 2010, 83 pages.
*Waddington North America, Inc v. Sabert Corporation*, Civil Action No. 09-4883-JAG-MCA, Sabert's Invalidity Contentions and Supporting Documents, Mar. 9, 2010, 372 pages.
*Waddington North America, Inc v. Sabert Corporation*, Civil Action No. 09-4883-JAG-MCA, Sabert's Amended Invalidity Contentions and Supporting Documents, Apr. 19, 2010, 419 pages.
*Waddington North America, Inc v. Sabert Corporation*, Civil Action No. 09-4883-GEB-MCA, WNA's Brief No Anticipation, Document 49-1, Apr. 23, 2010, 27 pages.
*Waddington North America, Inc v. Sabert Corporation*, Civil Action No. 09-4883-GEB-MCA, Sabert's Letter RE: Inequitable Conduct and Exhibits, Document 53, May 5, 2010, 38 pages.
*Waddington North America, Inc v. Sabert Corporation*, Civil Action No. 09-4883-GEB-MCA, WNA's Attorney Letter to Court, Document 54, May 6, 2010, 15 pages.

*Waddington North America, Inc v. Sabert Corporation*, Civil Action No. 09-4883-GEB-MCA, Sabert's Opposition to Motion for Summary Judgment for No Anticipation, Document 57, May 24, 2010, 39 pages.
*Waddington North America, Inc v. Sabert Corporation*, Civil Action No. 09-4883-GEB-MCA, Sabert's Expert Report of Gary E. Vergason Regarding Claim Construction and Exhibits, Document 61, May 24, 2010, 87 pages.
*Waddington North America, Inc v. Sabert Corporation*, Civil Action No. 09-4883-GEB-MCA, Sabert's Opening Markman Brief, Document 80, Jul. 8, 2010, 55 pages.
*Waddington North America, Inc v. Sabert Corporation*, Civil Action No. 09-4883-GEB-MCA, WNA's Opening Claim Construction Brief, Document 79, Jul. 8, 2010, 39 pages.
*Waddington North America, Inc v. Sabert Corporation*, Civil Action No. 09-4883-GEB-MCA, WNA's Rebuttal Expert Declaration of Dr. Donald J. McClure Regarding Claim Construction, Document 79-3, Jul. 8, 2010, 20 pages.
*Waddington North America, Inc v. Sabert Corporation*, Civil Action No. 09-4883-GEB-MCA, WNA's Responsive Claim Construction Brief, Document 96, Sep. 20, 2010, 29 pages.
*Waddington North America, Inc v. Sabert Corporation*, Civil Action No. 09-4883-GEB-MCA, Sabert's Response to WNA's Opening Markman Brief, Document 97, Sep. 20, 2010, 48 pages.
*Waddington North America, Inc v. Sabert Corporation*, Civil Action No. 09-4883-GEB-MCA, Judge Brown's Memorandum Opinion Re: Motions, Document 99, Sep. 29, 2010, 21 pages.
*Waddington North America, Inc v. Sabert Corporation*, Civil Action No. 09-4883-GEB-MCA, Judge Brown's Memorandum Order Re: Motions, Document 100, Sep. 29, 2010, 2 pages.
Expert Statement of Donald J. McClure, Nov. 24, 2009, 6 pages.
*Waddington North America, Inc v. Sabert Corporation*, Civil Action No. 09-4883-GEB-MCA, Judge Brown's Markman Opinion, Document 112, Oct. 27, 2010, 19 pages.
*Waddington North America, Inc v. Sabert Corporation*, Civil Action No. 09-4883-GEB-MCA, Judge Brown's Markman Order, Document 113, Oct. 27, 2010, 5 pages.
*Waddington North America, Inc v. Sabert Corporation*, Civil Action No. 09-4883-GEB-MCA, Expert Report of Dr. Donald J. McClure, Jan. 11, 2011, 51 pages.
*Waddington North America, Inc v. Sabert Corporation*, Civil Action No. 09-4883-GEB-MCA, Expert Report of Dr. Donald J. McClure and Exhibits, Jan. 11, 2011, 51 pages.
*Waddington North America, Inc v. Sabert Corporation*, Civil Action No. 09-4883-GEB-MCA, Expert Report of Gary E. Vergason Regarding Obviousness, Jan. 13, 2011, 106 pages.
*Waddington North America, Inc v. Sabert Corporation*, Civil Action No. 09-4883-GEB-MCA, Expert Report of Craig Lubkey Regarding Samples Made and Prior Art, Jan. 13, 2011, 4 pages.
*Waddington North America, Inc v. Sabert Corporation*, Civil Action No. 09-4883-GEB-MCA, WNA's Rebuttal Expert Report of Dr. Donald J. McClure on Issues of Written Description and Obviousness, Jan. 28, 2011, 168 pages.
*Waddington North America, Inc v. Sabert Corporation*, Civil Action No. 09-4883-GEB-MCA, Notice of Motion in Limine to Strike Craig Lubkey Expert Report, Jan. 28, 2011, 227 pages.
*Waddington North America, Inc v. Sabert Corporation*, Civil Action No. 09-4883-GEB-MCA, Sabert's Memorandum in Opposition to WNA's Motion in Limine to Strike Craig Lubkey Expert Report, Document 145, Feb. 11, 2011, 2 pages.
*Waddington North America, Inc v. Sabert Corporation*, Civil Action No. 09-4883-GEB-MCA, Sabert's Memorandum of Law in Support of Its Summary Judgment Motion Re: Written Description, Document 138-2, Feb. 11, 2011, 49 pages.
*Waddington North America, Inc v. Sabert Corporation*, Civil Action No. 09-4883-GEB-MCA, Sabert's Memorandum of Law in Support of Its Summary Judgment Motion Re: Suitable for Food Contact, Document 142-2, Feb. 11, 2011, 45 pages.
*Waddington North America, Inc v. Sabert Corporation*, Civil Action No. 09-4883-GEB-MCA, Declaration of Gary E. Vergason in Support of Sabert's Summary Judgment Motion in Support of 2000nm, Document 140, Feb. 11, 2011, 131 pages.

*Waddington North America, Inc v. Sabert Corporation*, Civil Action No. 09-4883-GEB-MCA, Declaration of Gary E. Vergason in Support of Sabert's Summary Judgment Motion in Support of Suitable for Food Contact, Document 143, Feb. 11, 2011, 38 pages.
U.S. Appl. No. 60/368,818 USPTO Image File Wrapper, Mar. 29, 2002, 709 pages.
*Waddington North America, Inc v. Sabert Corporation*, Civil Action No. 09-4883-GEB-MCA, WNA's Brief Cross Motion for Summary Judgment of No Invalidity Re: Less Than 2000nm, Document 154-1, Feb. 11, 2011, 68 pages.
*Waddington North America, Inc v. Sabert Corporation*, Civil Action No. 09-4883-GEB-MCA, WNA's Brief Cross Motion for Summary Judgment of No Invalidity Re: Suitability for Food Contact, Document 155-1, Feb. 11, 2011, 111 pages.
*Waddington North America, Inc v. Sabert Corporation*, Civil Action No. 09-4883-GEB-MCA, Sabert's Memorandum of Law in Opposition to WNA's Summary Judgment Motion for Literal Infringement, Document 160, Feb. 11, 2011, 119 pages.
*Waddington North America, Inc v. Sabert Corporation*, Civil Action No. 09-4883-GEB-MCA, Sabert's Combined Reply Memorandum in Support of Its Summary Judgment Motion Re: Suitability for Food Contact and Opposition to WNA's Cross-Motion for Summary Judgement of No Invalidity and to Strike Portions of Vergason Declaration, Document 170, Mar. 7, 2011, 37 pages.
*Waddington North America, Inc v. Sabert Corporation*, Civil Action No. 09-4883-GEB-MCA, Declaration of Gary E. Vergason in Support of Sabert's Opposition to WNA's Cross Motion, Document 170-2, Mar. 7, 2011, 4 pages.
*Waddington North America, Inc v. Sabert Corporation*, Civil Action No. 09-4883-GEB-MCA, Final Pretrial Order, Document 174, Mar. 10, 2011, 222 pages.
*Waddington North America, Inc v. Sabert Corporation*, Civil Action No. 09-4883-GEB-MCA, Judge Brown's Memorandum Opinion Re: Less Than 2000nm, Document 181, Mar. 22, 2011, 16 pages.
*Waddington North America, Inc v. Sabert Corporation*, Civil Action No. 09-4883-GEB-MCA, Judge Brown's Order Re: Less Than 2000nmt, Document 182, Mar. 22, 2011, 2 pages.
*Waddington North America, Inc v. Sabert Corporation*, Civil Action No. 09-4883-GEB-MCA, Judge Brown's Memorandum Opinion Re: Suitable for Food Contact, Document 183, Mar. 22, 2011, 13 pages.
*Waddington North America, Inc v. Sabert Corporation*, Civil Action No. 09-4883-GEB-MCA, Judge Brown's Order Re: Suitable for Food Contact, Document 184, Mar. 22, 2011, 2 pages.
*Waddington North America, Inc v. Sabert Corporation*, Civil Action No. 09-4883-GEB-MCA, Judge Brown's Memorandum Opinion, Document 186, Mar. 22, 2011, 14 pages.
*Waddington North America, Inc v. Sabert Corporation*, Civil Action No. 09-4883-GEB-MCA, Judge Brown's Order Re: Miscellaneous Motions, Document 185, Mar. 22, 2011, 2 pages.
*Waddington North America, Inc v. Sabert Corporation*, Civil Action No. 09-4883-GEB-MCA, Transcripts of Jury Trial, Mar. 28, 2011, 1642 pages.
*Waddington North America, Inc v. Sabert Corporation*, Civil Action No. 09-4883-GEB-MCA, Jury Verdict, Document 232, Apr. 8, 2011, 1 page.
*Waddington North America, Inc v. Sabert Corporation*, Civil Action No. 09-4883-GEB-MCA, Sabert's Memorandum of Law in Support of Its Motion to Alter, Amend, and/or Correct the Judgment, Document 245-2, Apr. 21, 2011, 30 pages.
*Waddington North America, Inc v. Sabert Corporation*, Civil Action No. 09-4883-GEB-MCA, WNA's Brief in Support of Its Renewed Motion for Judgment as a Matter of Law, Document 247-1, Apr. 25, 2011, 32 pages.
*Waddington North America, Inc v. Sabert Corporation*, Civil Action No. 09-4883-GEB-MCA, WNA's Brief in Support of Its Motion for a New Trial, Document 248-1, Apr. 25, 2011, 33 pages.
*Waddington North America, Inc v. Sabert Corporation*, Civil Action No. 09-4883-GEB-MCA, Sabert's Memorandum of Law in Opposition to WNA's Renewed Motion for Judgment as a Matter of Law, Document 256, Jun. 6, 2011, 42 pages.
*Waddington North America, Inc v. Sabert Corporation*, Civil Action No. 09-4883-GEB-MCA, Sabert's Memorandum of Law in Opposition to WNA's Renewed Motion for Judgment as a Matter of Law—Appendix, Document 256-1, Jun. 6, 2011, 18 pages.
*Waddington North America, Inc v. Sabert Corporation*, Civil Action No. 09-4883-GEB-MCA, Sabert's Memorandum of Law in Opposition to WNA's Motion for a New Trial, Document 257, Jun. 6, 2011, 45 pages.
*Waddington North America, Inc v. Sabert Corporation*, Civil Action No. 09-4883-GEB-MCA, Sabert's Memorandum of Law in Opposition to WNA's Motion for a New Trial—Appendix, Document 257-1, Jun. 6, 2011, 6 pages.
*Waddington North America, Inc v. Sabert Corporation*, Civil Action No. 09-4883-GEB-MCA, WNA's Reply Brief in Further Support of Its Renewed Motion for Judgment as a Matter of Law, Document 258, Jun. 13, 2011, 15 pages.
*Waddington North America, Inc v. Sabert Corporation*, Civil Action No. 09-4883-GEB-MCA, WNA's Reply Brief in Further Support of Its Motion for a New Trial, Document 259, Jun. 13, 2011, 15 pages.
*Waddington North America, Inc v. Sabert Corporation*, Civil Action No. 09-4883-GEB-MCA, Sabert's Memorandum in Reply to WNA's Opposition to Sabert's Motion to Alter, Amend, and/or Correct the Judgment, Document 260, Jun. 13, 2011, 34 pages.
*Waddington North America, Inc v. Sabert Corporation*, Civil Action No. 09-4883-GEB-MCA, Transcript of Deposition of Gary E. Vergason, Jul. 23, 2007, 60 pages.
*Waddington North America, Inc v. Sabert Corporation*, Civil Action No. 09-4883-GEB-MCA, Transcript of Deposition of Mike Evans, Dec. 3, 2010, 128 pages.
*Waddington North America, Inc v. Sabert Corporation*, Civil Action No. 09-4883-GEB-MCA, Transcript of Deposition of Albert I. Salama, Dec. 10, 2010, 151 pages.
*Waddington North America, Inc v. Sabert Corporation*, Civil Action No. 09-4883-GEB-MCA, Transcript of Deposition of Darryl Nazareth, Dec. 13, 2010, 172 pages.
*Waddington North America, Inc v. Sabert Corporation*, Civil Action No. 09-4883-GEB-MCA, Transcript of Deposition of Richard Sugerman, Dec. 15, 2010, 56 pages.
*Waddington North America, Inc v. Sabert Corporation*, Civil Action No. 09-4883-GEB-MCA, Transcript of Deposition of Donald G. Parent, Dec. 17, 2010, 139 pages.
*Waddington North America, Inc v. Sabert Corporation*, Civil Action No. 09-4883-GEB-MCA, Transcript of Deposition of Dr. Ashish K. Mithal, Dec. 23, 2010, 74 pages.
Emi Yoshi, Inc., Request for Inter Partes Reexamination, filed Nov. 22, 2011, 88 pages.
*Waddington North America, Inc v. Sabert Corporation*, Civil Action No. 11-7131-FLW-TJB, Final Judgement on Consent, Feb. 10, 2012, 2 pages.
USPTO Office Action for Inter Partes Reexamination Control No. 95/001,833, dated Jan. 19, 2012, 38 pages.
USPTO Decision Granting Petition to Terminate Inter Partes Reexamination Proceeding for Inter Partes Reexamination Control No. 95/001,833, dated Mar. 7, 2012, 6 pages.

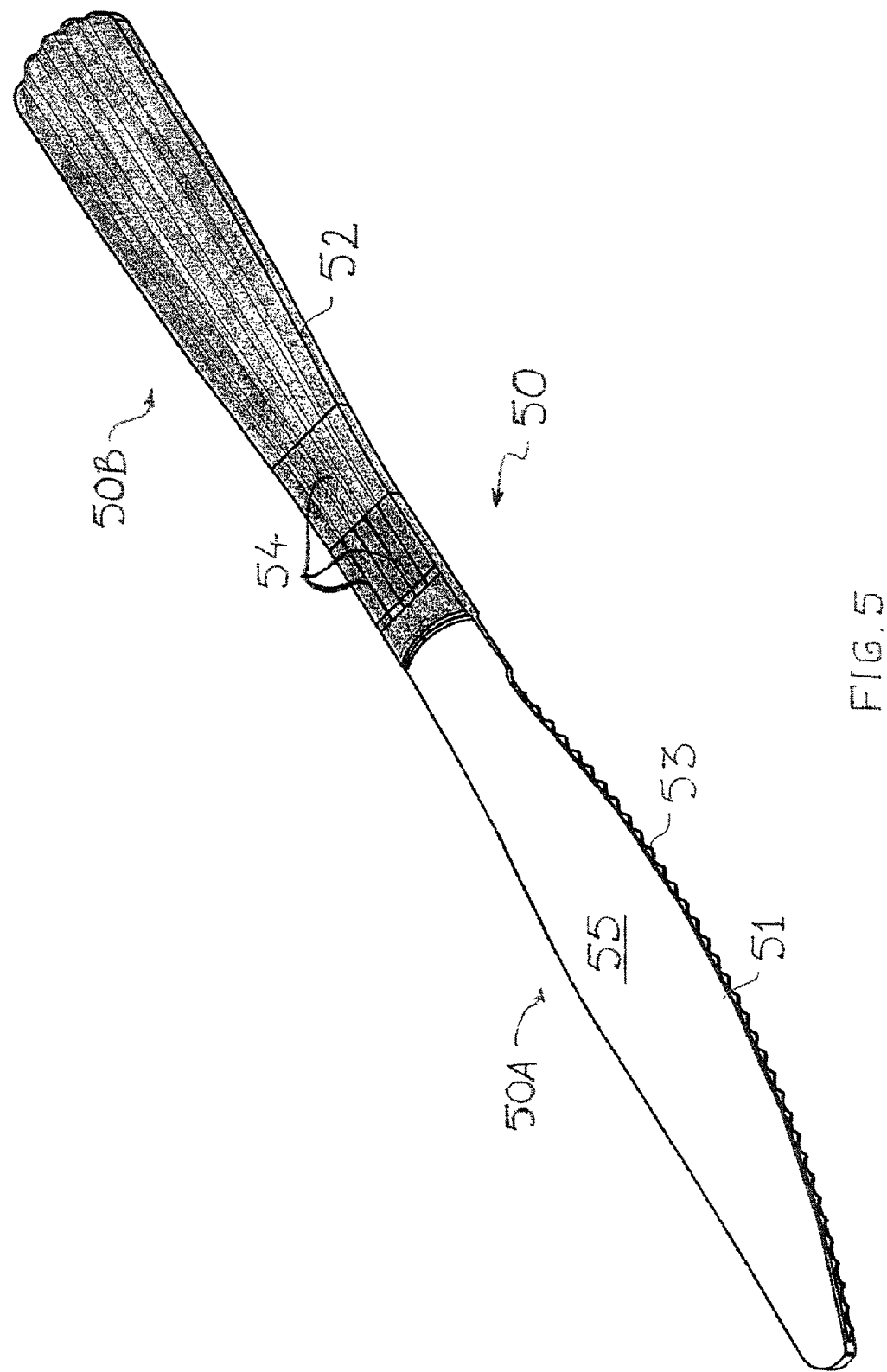

METALLIZED CUTLERY AND TABLEWARE AND METHOD THEREFOR

RELATED APPLICATIONS

This application is a continuation of U.S. patent application Ser. No. 11/123,409, filed May 6, 2005, which is a continuation-in-part application of U.S. patent application Ser. No. 10/228,147, filed Aug. 26, 2002, which, in turn claims the benefit of U.S. Provisional Patent Application No. 60/314,677, filed Aug. 24, 2001; said applications are incorporated herein, in their entirety, by reference for all purposes.

FIELD OF THE INVENTION

This invention relates generally to the production of food-service articles for household, catering and restaurant use including commercial and institutional tableware. More particularly, this invention relates to plastic cutlery having a reflective or metallic appearance.

BACKGROUND OF THE INVENTION

Disposable plastic food-service items are in increasingly widespread use for storing, serving and consuming food, due to their reasonably low-cost and the convenience they provide. Disposable food containers and articles inter alia include non-returnable containers such as yogurt cups and dinner entrée packaging; microwavable storage containers; and, general tableware items such as plastic plates, cups and cutlery. The increasing popularity of fast-food restaurant chains further fuels the demand for plastic tableware and takeout packaging. In addition to the fast food restaurants, caterers also prefer disposable food service items for the associated convenience, hygiene and competitive-costs. In this regard, it is important to note that replacement costs for disposable items such as cutlery articles are usually offset by clean-up costs (labor, materials and equipment) generally associated with permanent flatware. In addition, permanent flatware also has to be replaced due to inadvertent disposal or loss.

The presence of non-disposable metal cutlery along with other disposable food-service articles such as plates, cups and the like presents an unusual problem for restaurants and caterers. The problem stems from the loss of valuable metal cutlery into trash or refuse-containers along with disposable tableware and food remnants particularly during peak business hours and rush situations. As a result, the food establishment has to constantly replace expensive metal flatware. There has been a long-standing need to solve the problems relating to loss and inadvertent disposal of real silverware, as readily evidenced by the following excerpts taken from the patent literature:

U.S. Pat. No. 3,926,792, to Buford, filed on Aug. 23, 1973, in Column 1, lines 12 to 30 states:—"The food industry has long been plagued with the costly and time-consuming problem of separating valuable reusable items, such as metal tableware from solid waste, such as food, paper and other disposable items. This problem is prevalent in any food service facility, such as restaurants, cafeterias, schools, prisons, and so on, in which plates must be scraped and/or tableware separated from garbage by hand sorting or by scavenging, and especially in the airline industry where there is no opportunity for sorting in flight. Even when manual sorting or scavenging is carried out, it has been found that a large amount of tableware is lost. For example, a set of airline tableware only lasts about seven flights. It is obvious that continued replacement of tableware is not only expensive, but economically wasteful. Some restaurants have found that most missing tableware is lost, rather than taken by customers, and that such losses run as high as $1,300 on a traditionally heavy day."

U.S. Pat. No. 4,367,138, to Kustas, filed on Jun. 8, 1981, in Column 1, lines 11-16 states:—" . . . As is well-known in the restaurant business, the loss of silverware or stainless steel flatware is a very serious problem which costs restaurant owners large sums of money every year. The problem stems from careless kitchen help and the manner in which food and debris is removed from used dishes."

U.S. Pat. No. 4,632,253, to Stromgren et al., filed on Dec. 6, 1984, in Column 1, lines 35-49 states:—"In conjunction with a waiter scrapping food waste from plates into a waste container, it quite often happens that cutlery accompanies the waste into the container. For obvious reasons, the waiter avoids putting his arm down into the waste container to retrieve the dropped item. Studies made in restaurant kitchens in hotels associated with several intercontinental hotel chains show that not only an occasional item of cutlery is lost in this way, but even the cutlery used by all the guests at a table may be accidentally tipped into the waste container together with waste food, particularly when the restaurant is busy and the waiter rushed. It must be regarded as natural that the waiter also avoids taking up the cutlery dropped into the waste container in such circumstances."

In addition, market research conducted by Waddington North America, Inc., the assignee of the present invention, shows that caterers estimate a loss of 15% to 30% of permanent flatware annually.

Another problem that food caterers encounter is the ability to clean metal flatware utensils at certain locations and outdoor catering events. In preparation for such circumstances caterers tend to carry a large inventory of expensive metal cutlery. The use of disposable plastic cutlery for such catering events would eliminate the limitations with cleaning metal flatware, handling heavy metal cutlery or keeping a large inventory thereof. In addition, it is noteworthy that disposable cutlery offers significant handling advantages compared to its metal-counterparts. For example, a typical cutlery combination containing a fork, a knife, a tablespoon, and a teaspoon would weigh about 200 grams for metal flatware versus about 30 grams for premium plastic cutlery. Applying these weights to a hypothetical 250-person event would yield an overall weight for metal cutlery of about 110 lbs., as compared to only 16 lbs. for plastic cutlery.

After the tragic 9-11 terrorist attacks with hijacked airplanes and the potential threat resulting from misuse of stainless steel flatware as weapons, there has been an increased tendency for major airline organizations to utilize disposable plastic cutlery while serving meals during flights. However, the use of disposable plastic cutlery affects the image of the airline, especially in premium seating and higher priced flights. What is lacking in the industry is a silverware article that is authentic looking yet is made of plastic would allow the Airlines to preserve their upscale image, particularly in the premium passenger classes, while continuing to enhance flight safety and maintaining compliance with legal and regulatory mandates.

A significant number of upscale catering establishments utilize disposable plastic cups, plates, and bowls etc. for catering functions. However, there is a general preference for continued use of traditional metal cutlery, primarily because of a perception gap between disposable plastic cutlery articles and permanent flatware. Disposable cutlery articles are generally regarded as having less-than-classic appearance and not suited for an upscale presentation; while, permanent flatware is generally regarded as more upscale and having a superior image. This perception gap is not entirely due to the superior strength of permanent flatware. Although stainless steel cutlery or permanent flatware is stronger than plastic cutlery, heavy weight plastic cutlery is functionally adequate for most occasions. Thus, a primary obstacle for use of disposable plastic cutlery in upscale situations is the perception and the image associated with disposable plastic cutlery rather than its performance.

From the foregoing, it can be readily appreciated, that there is a need for cutlery and food-handling implements that offer the disposability and convenience of plastic cutlery and the upscale perception generally associated with permanent flatware. Bridging the perception gap between disposable plastic cutlery and permanent flatware would naturally lead to greater acceptance of disposable plastic cutlery for use in upscale situations, by caterers and other food-service establishments, where traditionally permanent flatware heretofore has been the only alternative.

With respect to plastic articles, there are a variety of methods for coloring and/or decorating plastic articles that have been employed in the art including—dyeing, pigmenting, printing, hot stamping, heat transfers, in-mold decorating, spray painting, and electroplating. Printing techniques have been further classified as silkscreen printing, gravure or offset printing, and pad transfer printing.

Coloring or pigmenting is one of the most common and inexpensive methods to modify or enhance the appearance of a plastic article. Coloring typically involves incorporating a pigment or a dye into the plastic resin that is used for molding plastic articles. Pigments can be in the form of solid color concentrates or in the form of liquid color. Metallic pigments are known in the art and are commercially available; however, it is the general experience of those skilled in the art that these metallic pigments do not impart an authentic metallic look. Furthermore, metallic pigments do not provide a plastic cutlery article that emulates the polished silver-like metallic appearance of fine cutlery or silverware. In fact, almost all commercial plastic tableware or cutlery articles made by utilizing a silver metallic pigment have a dull or grayish appearance. In addition, some of the formulations for metallic pigments have an odor which is less-than-desirable for a food-service item.

Printing with single or multi-colored inks is commonly used for decorating plastic articles. The types of inks that can be used with food service articles tend to be limited due to food contact, toxicity and environmental issues. In addition, at least some of the inks frequently require a protective overcoat to overcome food contact issues. Metallic inks are known in the art; however, metallic inks also have similar food contact drawbacks and are not adapted for use with food handling implements due to a variety of reasons. Firstly, it would be difficult to handle the three-dimensional shape of a fork or a spoon and to apply a uniform layer of metallic ink thereon in an economic or consistent manner. Secondly, metallic inks do not provide the characteristic reflective appearance of a polished stainless steel flatware item or similar metallic article. Thirdly, the appearance of metallic inks would be further marred by the necessity of adding a protective overcoat for safety and food contact purposes.

In-mold labeling or decorating refers to the technique for decorating a plastic article wherein a label is strategically placed inside the mold prior to molding and held against a mold face by vacuum or mechanical means, thereafter hot plastic resin is introduced into the mold to effect label adhesion onto the molded part; and, thereby the label and the molded part are integrated into a unified article. Although, it is conceivable that a metallic label can be devised for use in injection molding, in-mold labeling is mostly limited for parts that either have a planar surface or a smooth curved surface such as the outer wall of a cup. In-mold labeling is not readily or economically adaptable for articles having complex three dimensional shapes such as typical spoons or forks. In addition to general shape constraints, in-mold labeling operation on a cutlery article would further prove to be quite challenging due to the presence of ornate features or fine and intricate patterns frequently incorporated on the surface of a plastic cutlery article for commercial acceptance and in consistency with traditional flatware design trends. It would be readily recognized by those of ordinary skill that the presence of any delicate design features on the surface of the article would interfere with in-mold label adhesion, which in turn would lead to wrinkling of the label on the part surface and detract from the overall appearance of the cutlery article.

Heat transfers and hot-stamping techniques provide additional options for decorating plastic articles. In particular, metal foil stamping can provide an authentic metallic-look when strategically placed on a plastic surface. Once again these techniques are not suited for articles having complex three-dimensional geometry such as cutlery articles. Foil wrinkling and/or inconsistent adhesion in the intricate detail areas of a cutlery article limit the utility of the foil stamping process for obtaining disposable cutlery having the appearance of permanent flatware or authentic silverware.

Electroplating methods for metallizing plastic cutlery articles are undesirable due to the environmental impact associated with electroplating chemicals as is known in the art. In addition, not all plastics can be readily electroplated. Furthermore, electroplating offers several challenges in terms of handling and processing cutlery articles economically.

Various metallizing methods have been described in the art, including U.S. Pat. No. 5,022,554 that describes metallized tableware, such as plates, cups, etc., made of a paper substrate, a metallized plastic film joined to the substrate, and an FDA approved top coating over the plastic film. This method of obtaining a metallic-look food service items by laminating a metallized film is not readily applicable to cutlery due to the fact that most plastic cutlery is generally produced by the injection-molding process wherein the feedstock is thermoplastic resin pellets and not laminated film. The shortcomings of incorporating a metallic foil or label during injection molding plastic cutlery have been discussed herein above. Similar shortcomings would typically apply to the use of a laminated metallic film.

Other approaches to metallization such as those used by Quest et al. (U.S. Pat. Nos. 5,177,124 and 5,280,052) describe a utilitarian and/or decorative object and a method for forming plastic parts having a metallic outer face, appearance and hand. In this technique, a mixture of a liquid monomer, curing agent, a dispersion of metal particles and floatable particles are poured into a mold. The mold is then centrifuged to cause the metal particles to migrate towards the surface of the piece before the monomer polymerizes and hardens to bind the particles. After removal from the mold, the outer face of the piece is polished and buffed to remove the plastic skin from the metal surface, whereby the resultant plastic piece simulates the appearance of a solid metal piece. This method is generally too cumbersome for application to plastic cutlery as most plastic cutlery is either made of polystyrene and/or polypropylene which are thermoplastic polymeric materials and do not easily lend themselves to the teachings of the referenced art. In addition, the typical process for producing cutlery is injection molding and it is difficult and cost-prohibitive to rotate a heavy injection mold. And, finally the secondary step of cleaning and buffing the plastic piece is expensive and may be unacceptable for food-service use.

Various references are available on plating of plastic materials by chemical deposition techniques, electro-deposition techniques and/or a combination thereof. Some plating methods are described in U.S. Pat. Nos. 3,607,350; 3,629,922; 3,896,252; 3,962,494; 4, 4,610,895; 3,445,350; 4,039,714; 4,073,743; 4,195,117; and 4,810,333. These techniques are essentially wet processes and require that parts be brought into contact with solutions containing metal ions, which must then be washed off to remove any residual chemicals and for general hygiene reasons for a food service article. These processes are relatively unattractive for metallizing cutlery because of the high processing and environmental costs.

Thus, it can be readily established that there is a need for fine plastic cutlery that has an enhanced visual and commercial appeal. The improved plastic cutlery should be inexpensive, permitting simple disposal and not requiring separation from food refuse. Such an invention should be manufactured without environmental shortcomings generally associated with metal-plating wet processes. An improved plastic cutlery article should be fabricated primarily from plastic materials, yet have the appearance of genuine metal on the outer surface such that it is practically indistinguishable, at least visually, from a fine metal flatware or cutlery article.

SUMMARY OF THE INVENTION

The present invention is devised in the light of the problems described herein. Accordingly it is a general object of the present invention to provide cutlery or flatware items that can (a) solve problems associated with present techniques for enhancing the visual appeal and upscale image of disposable plastic cutlery; (b) address the specific long-felt need for solving problems related to inadvertent loss and disposal of permanent flatware at restaurants and catering events; and (c) bridge the perception gap between disposable plastic cutlery and permanent flatware. In one aspect of the invention these needs are met by imparting a metallic appearance to disposable plastic cutlery or flatware articles.

The present invention was derived in-part from the recognition that—imparting a metallic appearance to disposable plastic cutlery would enhance the perceived value and quality of the cutlery items and bridge the perception gap between plastic cutlery and permanent flatware.

The same is true for the additional tableware items such as cups and plates. Employing a metallic appearance such as gold or silver to the plates and cups to coordinate with the cutlery enhances the aesthetics and provides a more regal presentation. The state of the art generally does not introduce metallized plastic cups and plates due to the difficulties discussed herein. Thus while the present description focuses on cutlery, the information is also relevant to other tableware items and is within the scope of the present invention.

One of the objects of the invention is to provide premium disposable cutlery item(s) fabricated mainly from plastic materials and having a metallic surface appearance that simulates genuine metal or permanent flatware.

Yet another object of the present invention is to provide a method, which lends itself to mass production of plastic cutlery having an authentic metallic appearance at a reasonable cost for disposable use.

Still another object of the present invention is to provide a method for metallizing injection-molded plastic cutlery at a reasonable incremental cost.

A further object of the present invention is to provide disposable cutlery that has the appearance of fine metal cutlery.

A further object of the present invention is to obtain a plastic object, such as a cutlery item, which is molded from a light transmitting thermoplastic material and is subsequently metallized.

Another object of the present invention is to provide a method for metallizing plastic cutlery articles that obviates the need for coating articles on both sides for emulating metal silverware.

Still another object of the present invention is to provide a plastic article such as a cutlery item, molded from a light transmitting thermoplastic material, which is metallized on one side only. In this respect, it is worth mentioning that plated metal silverware is generally plated on both sides of the metallic substrate—display side as well as underside. One of the unexpected aspects and novelty of the present invention is that the disposable plastic cutlery articles having the appearance of real silverware can be obtained in a commercially viable and economically attractive fashion by metallizing—on one side only. In other words, a clear or light-transmitting plastic cutlery article can be metallized on one side only with practically the same results and/or appearance as a cutlery article coated on both sides.

Still another object of the present invention is to provide a plastic cutlery article that emulates the reflective appearance of permanent flatware without being coated throughout and/or on all sides.

A further object of the present invention is to provide cutlery items having a surface geometry that cooperates with the metallic coating. Cutlery items according to this aspect of the invention are characterized by having a plurality of surface design features including alternating concave and convex areas, ribs, flutes, ornate patterns and other artistic features that enhance the reflective appearance and commercial appeal of the metallized plastic cutlery.

A further object of the invention is to provide metallized cutlery articles with design features or areas that have contrasting reflective properties in comparison to the rest of the article, and therefore become sharply defined and visibly distinct and further add to the commercial appeal of the metallized articles. For instance, the surface of the plastic article may include alternating smooth and textured areas, or alternating engraved and non-engraved areas, or patterns thereof that, upon metallization, are adapted to standout and highlight the reflective contrast between the smooth and textured areas or between the engraved and non-engraved areas of the plastic article.

An additional object of the present invention is to provide a method for improving the adhesion between the metallic coating layer and the plastic substrate by subjecting the metallized plastic cutlery items to a post-metallizing curing step.

Another object of the present invention is to provide a method for improving the adhesion between the metallic coating layer and the plastic substrate by pre-treating the plastic cutlery article with treatments such as flame treatment, plasma treatment or subjecting it to a corona discharge.

Still another object of the present invention is to provide metallized plastic cutlery items, with improved abrasion resistance and adhesion between the plastic article and the metallic coating layer, by applying a clear coating over the thin metallic coating layer. The clear coating or overcoat enhances the abrasion resistance characteristics of the metallic layer and can be applied by spraying or other means. FDA approved versions of over coating compositions can be readily obtained from a variety of vendors.

A further object of the present invention is to provide metallized cutlery, with improved abrasion resistance and adhesion between the plastic article and the metallic coating layer, by applying a clear silicon dioxide plasma coating over the thin metallic coating layer.

Yet another object of the present invention is to provide metallized cutlery items having good opacity and enhanced optical density by incorporating a color tint, such as a gray tint, in the base plastic resin material.

An object of the invention is a metallized plastic food service item, comprising a plastic tableware article with a thin metallic coating deposited on the plastic tableware item, wherein the thin metallic coating is deposited by a vacuum deposition process. The tableware items include cutlery such as forks, spoons, knives, as well as other tableware items such as trays, plates, bowls, and cups.

Yet a further object of the invention is a metallized plastic food service item, wherein the thin metallic coating is selected of a metal from the group consisting of silver, steel, stainless steel, chromium, aluminum, copper and gold. For commercial reasons, the thin metallic coating is generally less than 3000 nanometers (nm) and in one embodiment of the invention is less than 1000 nm. In a further embodiment of the invention the thin metallic coating is less than 200 nm. In addition, the article can further comprise a thin overcoat of a curable clear coating on the thin metallic coating. In addition, the plastic tableware article can have the metallic coating disposed on a single surface of the plastic tableware article.

An additional object of the invention is a metallized plastic food service item, wherein the plastic tableware article is composed of polystyrene or other light transmitting plastic material and is produced by injection molding; and, wherein the metallized plastic food service item has an optical density of less than 5.5 and preferably less than 2.0 as measured by a densitometer. Optical density should be greater than about 0.5 as the aesthetic appearance at lower values is not highly pleasing.

An object of the invention is a metallized plastic food service article produced by the process comprising the steps of forming a plastic body by injection molding, placing the plastic body into a vacuum metallizing unit, and depositing on the plastic body a thin metallic coating by a vacuum deposition process. In one embodiment the vacuum deposition process is physical vapor deposition, and in particular sputtering vapor deposition, with the sputtering deposition process utilizing plasma generated by Argon or mixtures of Argon and Nitrogen.

A further object of the invention is to enhance the adhesion and abrasion resistance of the metallic coating by holding the metallized articles in a clean and dry area and subjecting them to spontaneous curing for a period ranging from about one day to about two weeks.

Still other objects and advantages of the present invention will become readily apparent to those skilled in this art from the following detailed description, wherein we have shown and described only a few embodiments of the invention, simply by way of illustration of certain modes contemplated by us for carrying out our invention. As will be realized, the invention is capable of a variety of different embodiments, and its several details are capable of modifications in various respects, all without departing from the spirit and the scope of the invention.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The present invention will be readily understood by the following detailed description in conjunction with the accompanying drawings, wherein like reference numerals designate like structural elements, and in which:

FIG. 5 is an isometric view of a knife with metallic coating deposited on a portion thereof in accordance with an embodiment of the invention.

DETAILED DESCRIPTION OF THE INVENTION

Figure 1A:
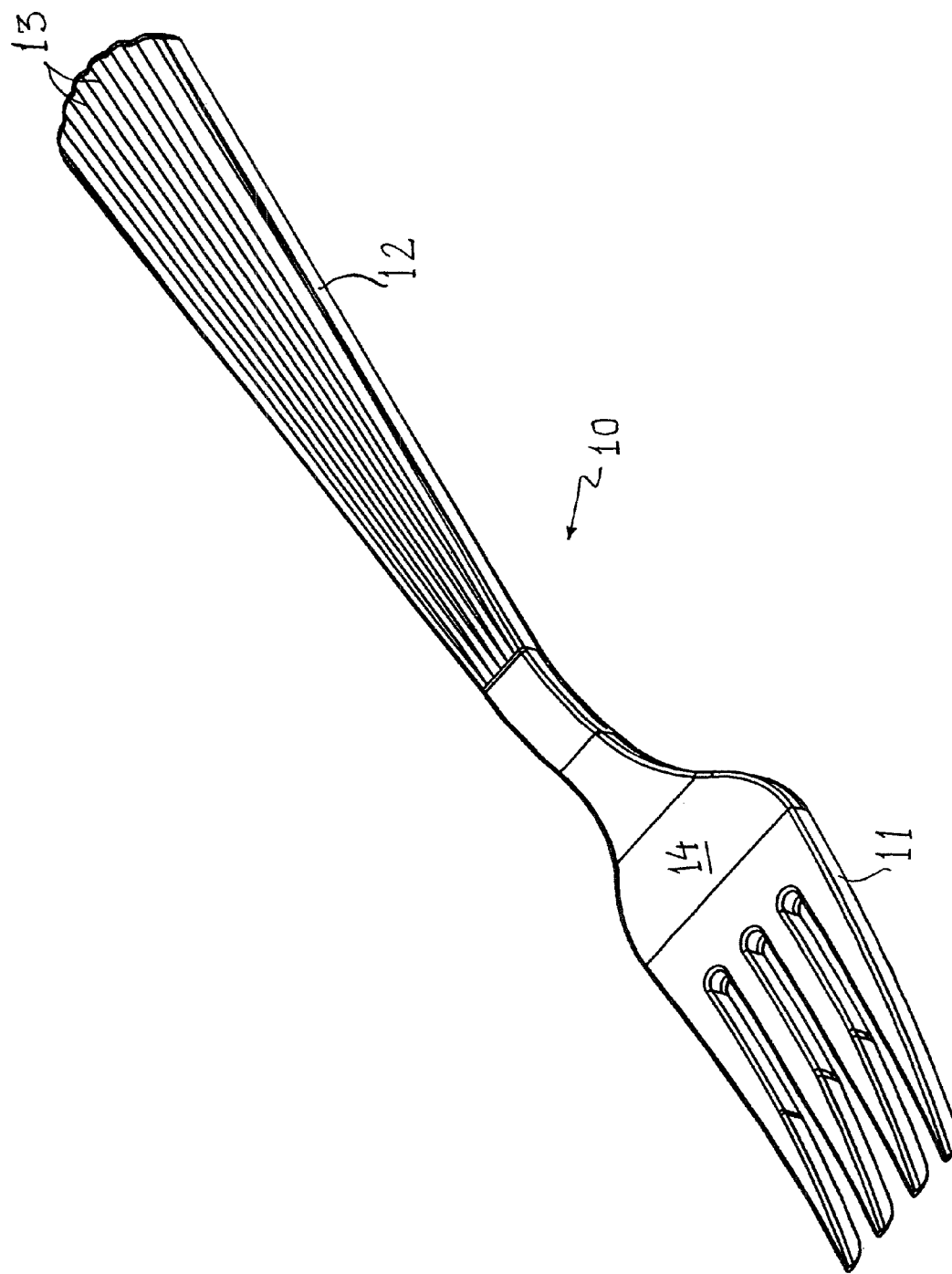
FIG. 1A shows an isometric view of a fork with metallic coating that has been constructed in accordance with an embodiment of the invention.

One intention of the instant invention, inter alia, was to develop disposable cutlery articles that emulate permanent flatware or metal silverware. The present invention recognizes that—imparting a metallic appearance to disposable plastic cutlery would enhance the perceived value and quality of the cutlery items and bridge the perception gap between plastic cutlery and permanent flatware. Prior to the instant invention there were two main classes of flatware or cutlery—(1) Permanent Flatware or Silverware, characterized by its durability, metallic appearance and upscale image; and, (2) Plastic Cutlery known for its convenience and disposable characteristics but generally regarded as a low-end alternative to permanent flatware and not as aesthetically attractive. The instant invention provides a new category of plastic flatware articles that retain their disposable character yet offer the upscale image, reflective appearance and elegance comparable to their more expensive silverware counterparts.

Historically, "silverware" has been around for centuries, while "stainless steel cutlery" was developed and patented around 1916 and has been around commercially since around the 1920s. The development of stainless steel cutlery is generally attributed to Harry Brearley of Sheffield, England (U.S. Pat. No. 1,197,256 titled "Cutlery", Sep. 5, 1916). Plastic cutlery has been around at least since 1960s. This is corroborated by the filing dates and subject matter in U.S. Pat. No. 3,136,416. Specifically, in Column 1, lines 8-11 of U.S. Pat. No. 3,136,416 to Goldrosen filed on Nov. 22, 1961, particular reference is made to molded forks, knives and spoons.

Despite the facts that—plastic cutlery has been available for at least 40 years; stainless steel cutlery has been around for over 80 years; silver-plated metal flatware was available for several centuries; and metallizing methods have also been known in the art—there was no plastic cutlery product that emulated permanent flatware or metal silverware prior to the instant invention.

The term "silverware" refers to flatware or cutlery articles that are either made of silver or made of a metallic materials and then silver plated. The term is sometimes also used generically for metal or stainless steel flatware. The Encyclopedia Britannica defines "silverware" as "table knives, forks and spoons that are made of silver"; while Dictionary.com defines silverware as "(1) Hollowware and flatware made of or plated with silver; and (2) Metal eating or serving utensils". Thus, for all purposes "silverware" connotes either silver flatware; or silver-plated flatware; or just generically metal flatware or cutlery, which may be silver in appearance or any other metallic appearance.

The terms such as cutlery, flatware, serving cutlery, cutlery items, cutlery articles, utensils, eating implements, food implements, food service tools, or food-handling implements as used in this description and claims are used in a generic and broad sense. These terms encompass disposable plastic cutlery items molded into standard food-handling or serving implements such as forks, spoons, knives, serving utensils and/or combinations thereof including spatulas, sporks, ladles, seafood forks, seafood picks, soup spoons, and the like. Accompanying items such as napkin rings, candle holders, and centerpiece receptacles are sometimes designed to match the cutlery items. Finally, the various assortments of goblets, glasses, soup bowls, dishes, plates, trays, champagne flutes, lids, and the like are also sometimes matched to the rest of the serving items and are all within the scope of the present invention wherein all these articles are considered tableware. The embodiments are merely illustrations of the techniques, and there are many other variations and applications all within the scope of the invention.

In contrast to metal flatware which exhibits the color of the material of construction or the subsequent plating treatment imparted to the article, plastic flatware or cutlery is generally available in either "natural, clear or non-colored" or "colored" forms or versions. Disposable cutlery items, which are currently sold in the marketplace, are typically constructed of either polystyrene and/or polypropylene resins. Most commercial plastic cutlery which is "natural, clear or non-colored" is made of clear polystyrene resin and exhibits the transparent characteristics of the material of construction namely polystyrene. "Colored" plastic cutlery can be made of either polystyrene or polypropylene and is generally colored by using a "color concentrate" that is added to the base resin in an injection molding process.

In light of the above disclosure and utility of metallizing plastic cutlery articles with the purpose of simulating metal flatware—it would be apparently desirable, for a person of ordinary skill, to metallize or coat plastic cutlery articles throughout, in other words on all sides and surfaces of the article. All cutlery articles heretofore have been completely coated on all sides. This typical approach of coating the entire article would lead a person of ordinary skill towards either, electroplating type processes wherein the entire article can be submerged in a plating solution; or, other metallizing processes where cutlery articles are subjected to the metallizing source at least twice—firstly to coat the display side (face side) and, secondly to coat the underside or undersurface of the cutlery articles. It would be readily recognized that both of the approaches for practicing the invention of metallizing cutlery articles, namely by coating the articles in a plating bath or subjecting them to metallizing twice have disadvantages that make them neither practical nor economical. Furthermore, plating has other disadvantages which have been discussed herein.

The inventors overcame the problem of preserving the economics of metallizing plastic cutlery articles without resorting to a plating process or to a two stage metallizing method. One of the unexpected and novel aspects of the present invention is that the disposable plastic cutlery articles having the appearance of metal silverware or permanent flatware can be obtained in a commercially viable and economically attractive fashion by molding plastic cutlery articles from clear or light-transmitting resins and metallizing them on one side only. In other words, a clear or light-transmitting plastic cutlery article can be metallized on one side only with practically the same results and/or appearance as a cutlery article coated on both sides.

In a further embodiment of the invention, currently being practiced commercially, the plastic cutlery articles are vacuum metallized on one side only and yet achieve the desired appearance and result of emulating a metal silverware or permanent flatware article. It is worth noting that permanent flatware is either plated on both sides or the entire article is constructed from the same bulk material throughout, whereby typical flatware articles generally exhibit similar appearance on all sides thereof. The plastic cutlery article according to a third embodiment is molded from crystal polystyrene resin and is vacuum metallized on one side only.

Also, it should be readily apparent that metallizing or depositing the metal layer on only one side of the article offers several economic advantages in comparison to coating the entire article. Firstly, there are coating or metal material savings, as approximately only one-half of the surface area of the parts is metallized. Secondly, there are metallizing process savings as parts are subjected to the deposition mechanism only once, and only one pass through the metallizer or metallizing equipment is required. Thirdly, there are output or productivity gains resulting from shorter cycle times as the same metallizing equipment or asset can coat or metallize twice as many parts with only one sided coating as would be possible for metallized parts requiring coating on both sides thereof. Lastly, one sided coating simplifies part handling as no turning or flipping of the parts for metallizing the underside or second side is required.

Thus, while the metallized cutlery can be coated on both sides, coating the cutlery articles on both sides is more expensive and economically less attractive, as two metallizing cycles would be required to coat both sides of the articles resulting in reduced output per unit time; the metal material cost would be increased; the capital outlay would also increase, as in order to sustain an equivalent output rate additional metallizing machines would be required; lastly, coating both sides would require more complex part handling mechanisms for turning or flipping the parts for presenting the second side of the articles for metallizing, without affecting or scratching the metallic coating on the side previously metallized. Thus, the economic benefits of coating or metallizing on one side only, enhance the commercial viability of this embodiment of the invention and the ability to practice the invention in a competitive manner and offer metallized plastic cutlery at reasonable prices for disposable applications.

From an aesthetic standpoint the metallized coating is applied to the side which typically faces up in a traditional table-setting for placing cutlery implements. A traditional place setting typically includes a fork with tine facing upwards, a spoon with the concave bowl facing upwards and a knife with the serrated edge placed pointing left and away from the user; handle portions of all eating implements are towards the user. Various other tableware articles may accompany the traditional setting.

It would be clear to those skilled in the art that a variety of thermoplastic polymer types and/or resin grades can be employed for the purpose of making the cutlery items of the present invention. Material choices for such applications are governed by a variety of factors including consumer preferences, cost, engineering requirements, availability and other economic and market factors. The primary selection criteria for a base plastic material or resin include (1) mechanical and thermal functionality with respect to strength, rigidity, and use temperature; (2) acceptable melt viscosity and flow properties for injection molding into desired shapes with high surface gloss; (3) ability to withstand the metallizing process and offering reasonably high surface energy to effect good adhesion between the plastic resin and the applied metal layer; (4) reasonable cost for disposable use; and (5) good optical and surface gloss properties.

According to an embodiment of the invention, wherein the cutlery articles are coated on one side only, the light transmission characteristics or transparency of the material are also important for obtaining metallized cutlery articles that emulate metal flatware, and offer the appearance of being coated on both sides (the metallized side as well as the opposing side) yet are coated on one side only.

Several thermoplastic resins having the desired optical and functional characteristics including polystyrene (PS), polymethyl methacrylate (PMMA), acrylonitrile-butadiene-styrene (ABS), styrene-acrylonitrile (SAN) and polycarbonate (PC) can be employed for achieving the objects of this invention. Polystyrene (PS) was the material of choice for some embodiments of the invention. Polystyrene resin has a lower cost compared to ABS, PC and SAN. It is the general experience of those skilled in the art that polystyrene cutlery is perceived as the higher end disposable cutlery in the marketplace. One criterion for selecting crystal polystyrene for this application is the relatively high flexural modulus of polystyrene compared to other resin materials in an equivalent price range. More specifically, the flexural modulus of polystyrene is superior to that of polypropylene. Crystal polystyrene has excellent light transmission characteristics due to its amorphous polymeric structure as opposed to polypropylene, which is highly crystalline in nature. In addition, variable cooling rates such as are encountered in the injection molding process have little effect on the light transmission characteristics of the molded article due to the amorphous polymeric structure of polystyrene. In other words, crystal polystyrene has a large processing window with respect to its optical characteristics. In addition, polystyrene exhibits a higher surface energy compared to polypropylene and other polyolefins and, therefore, offers better metal-to-substrate adhesion compared to polyolefin resins.

Thus, in one embodiment of the present invention, the cutlery items are molded from a suitable crystal polystyrene resin grade having good clarity; physical properties; and, desirable flow, melt viscosity and molding characteristics from a production and manufacturing standpoint. Processing aids that are routinely added to commercial resins such as mineral oil and surface waxes are exuded to the surface of the part and interfere with obtaining adequate adhesion between the deposited metal and the part surface. Therefore, in order to ensure that durable metal coatings are deposited on the surface of the cutlery article, the resin used must be of high quality and primarily free of mineral oil and other volatiles.

It will be recognized by those skilled in the art that the reflective appearance of a metallized plastic article would, inter alia, be influenced by the surface characteristics of the unmetallized plastic article; the metal coating itself, the tint coloration of the article, and the thickness of the metal coating. Coatings deposited by vacuum or vapor deposition are sufficiently thin to replicate the surface of the substrate. Therefore, metallic coatings deposited on smooth and polished surfaces will have higher reflectance compared to metallic coatings deposited on rough and unpolished surfaces.

Also, it is generally recognized that extremely thin coatings are generally not as reflective as thicker coatings. The non-reflective aspect of such thin coatings is utilized in food containers for microwave heating and browning of certain foods, wherein reflective characteristics for such articles would cause harmful effects such as sparking when subjected to microwave energy.

In addition, it is well known that certain metals are more reflective than others at comparable coating thickness. Accordingly, in one of the embodiments of the invention plastic cutlery articles are molded using a polished mold surface to obtain a smooth part surface finish after molding. The smooth surface or finish on the articles allows deposition of smooth and reflective metal coatings. It will be appreciated that in order to emulate the appearance of a metal silverware article the metal coating should resemble the metal silverware; and, the surface of the plastic cutlery article is sufficiently smooth to allow for deposition of a smooth metallic film. In one embodiment of the invention a plastic article is subjected to vacuum deposition and metallized with a thin coating of stainless steel that is at least 30 nanometers in thickness and typically more than 60 nanometers in thickness, yet have an aesthetically pleasing reflective appearance.

It is well known in the art to provide an ornate pattern or design on the surface of a plastic part by engraving. According to another embodiment of the invention the cutlery articles can be further accentuated by providing alternating smooth and engraved surfaces during molding whereby the variations in surface finish on the part effect variations in reflectance after metallization of the cutlery articles and the reflective coating highlights the molded-in design.

Referring now to FIGS. 1A, 1B, 2A, 2B, 3A and 3B there are shown typical cutlery items, which have been constructed in accordance with the present invention wherein like parts are designated by like reference numerals.

FIG. 1A shows an isometric perspective view of a fork represented by reference numeral 10 having its general construction in accordance with the present invention. Fork 10 has a tines portion 11 and a handle portion 12. Fork 10 also contains surface features in the form of flutes or other geometrical artistic contours generally denoted by reference numeral 13. A surface-coating layer of metal is deposited on at least one of the surfaces of the plastic fork to impart the appearance of a metallic cutlery piece. In another embodiment of the invention the metallic coating is applied to the display side or the side that is facing-up in a typical place setting presentation for a food-event. The metallic coating on the plastic surface of the fork is denoted by reference numeral 14.

Figure 1B:
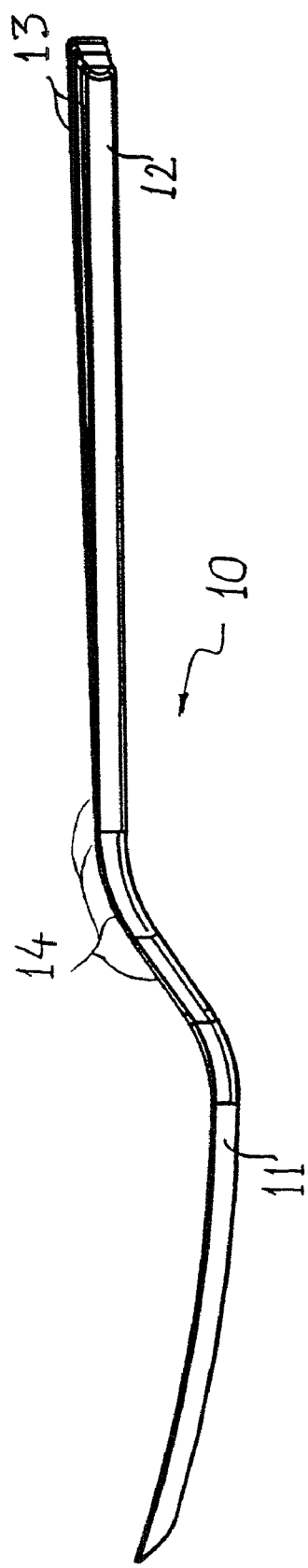
FIG. 1B is a side profile view of a fork with metallic coating in accordance with an embodiment of the invention.

FIG. 1B shows a side view of Fork 10 wherein the various fork portions are identified with the corresponding reference numeral designations of FIG. 1A. The metallic coating is imparted on only the upper face or display surface of the plastic fork and is represented by reference numeral 14.

Figure 2A:
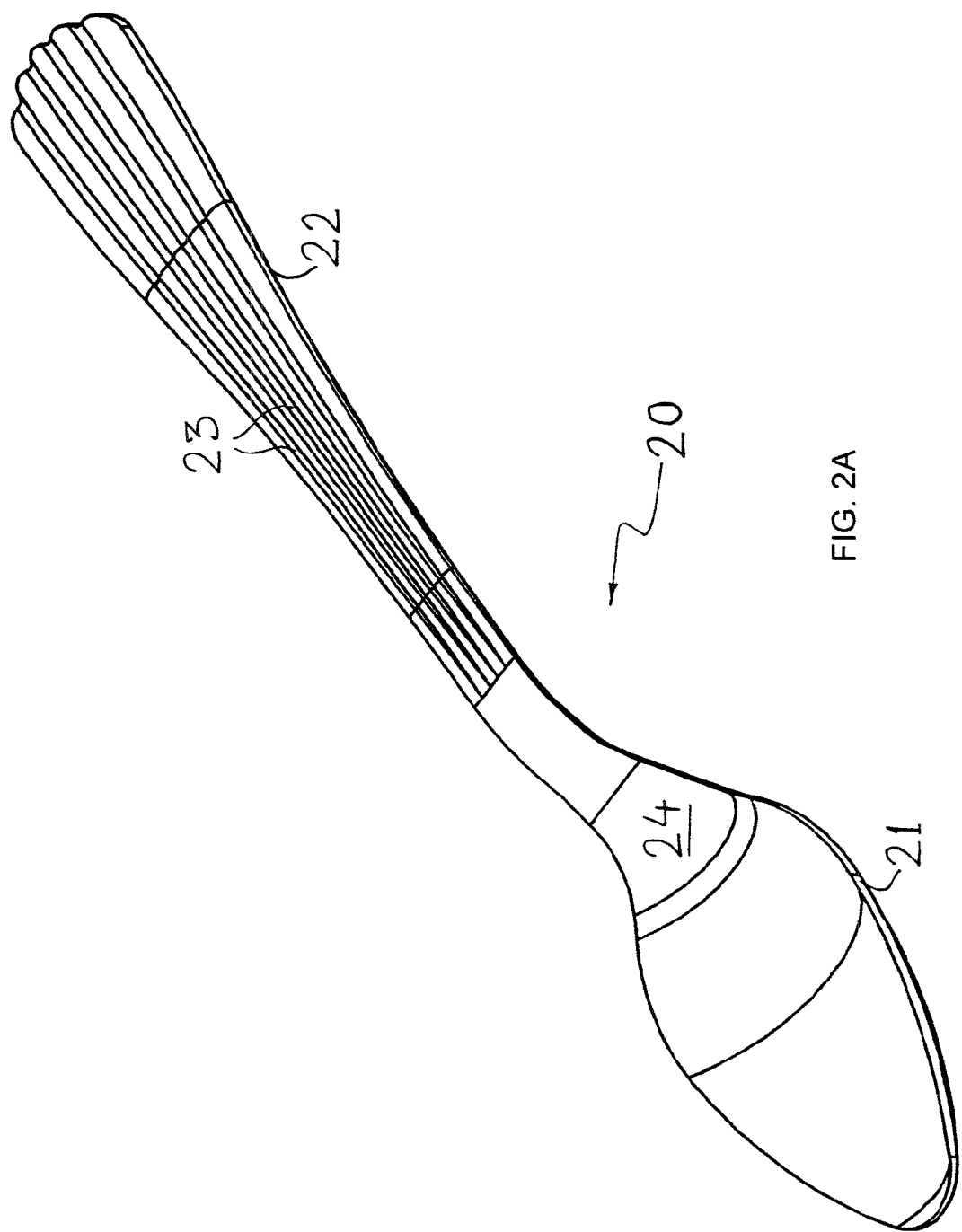
FIG. 2A is an isometric view of a spoon with metallic coating in accordance with an embodiment of the invention.
Figure 2B:
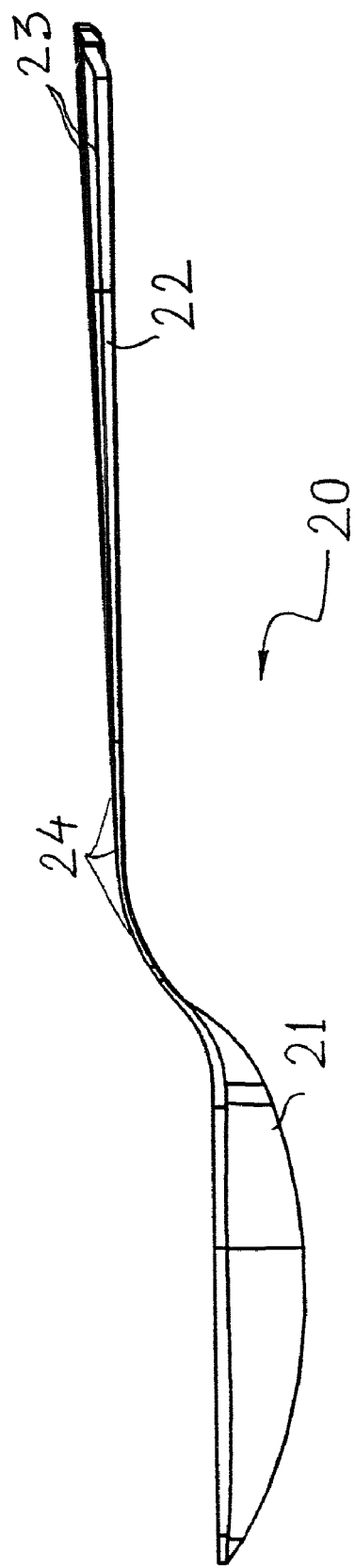
FIG. 2B is a side profile view of a spoon with metallic coating in accordance with an embodiment of the invention.

Referring now to FIG. 2A, there is shown an isometric perspective view of a spoon represented by reference numeral 20 having its general construction in accordance with the present invention. Similarly, FIG. 2B shows a side view of spoon 20 wherein like reference numerals represent like parts or features. Spoon 20 has a bowl portion 21 and a handle portion 22. Spoon 20 also contains surface features in the form of flutes or other geometrical artistic contours generally denoted by reference numeral 23. A surface-coating layer of metal is deposited on at least one of the surfaces of the plastic spoon to impart the appearance of a metallic cutlery piece. In a further embodiment of the invention the metallic coating is applied to the display side or the side that is facing-up in a typical place setting for a food-event. The metallic coating on the plastic surface of the spoon is denoted by reference numeral 24.

Figure 3A:
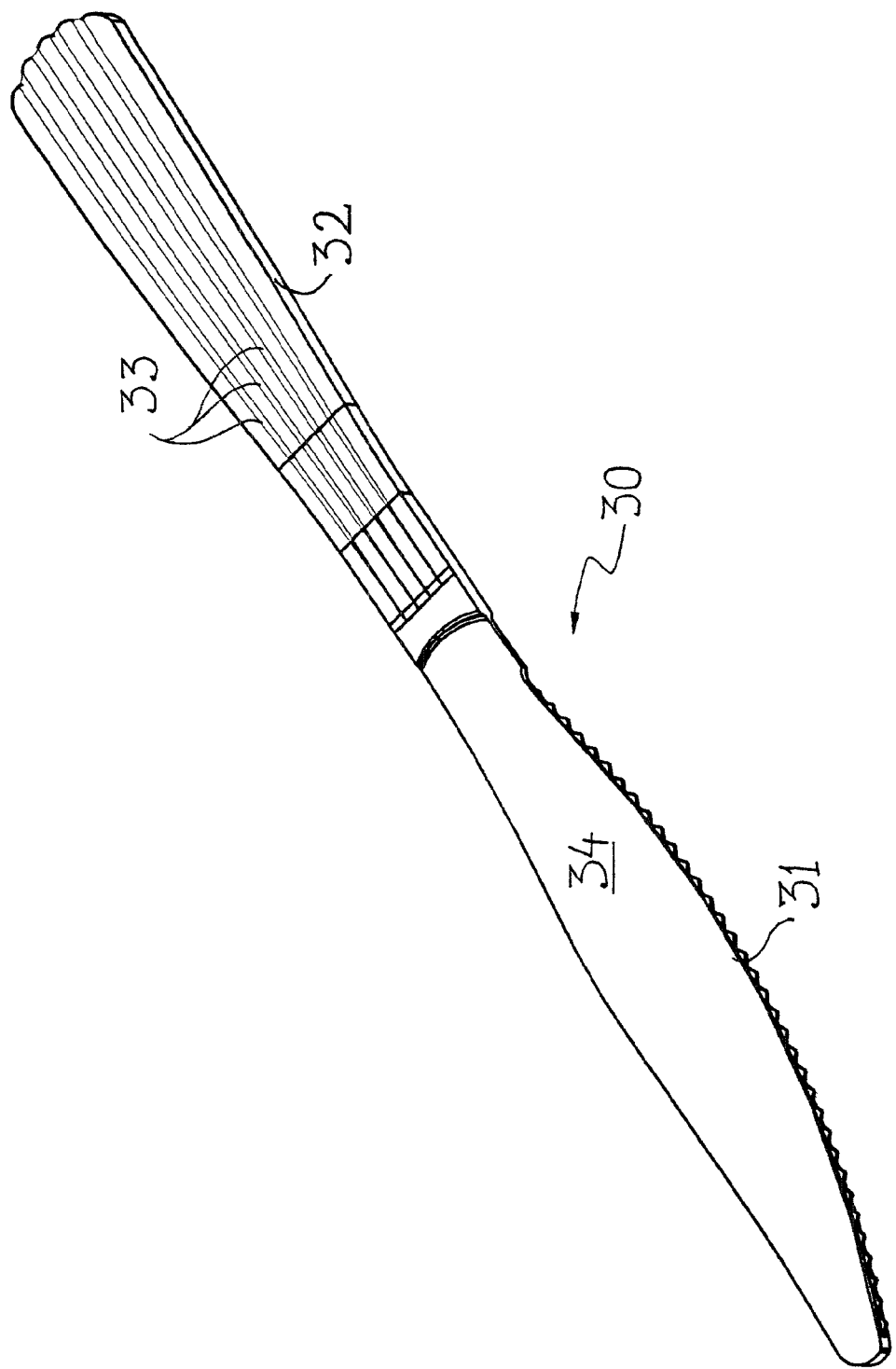
FIG. 3A is an isometric view of a knife with metallic coating in accordance with an embodiment of the invention.
Figure 3B:
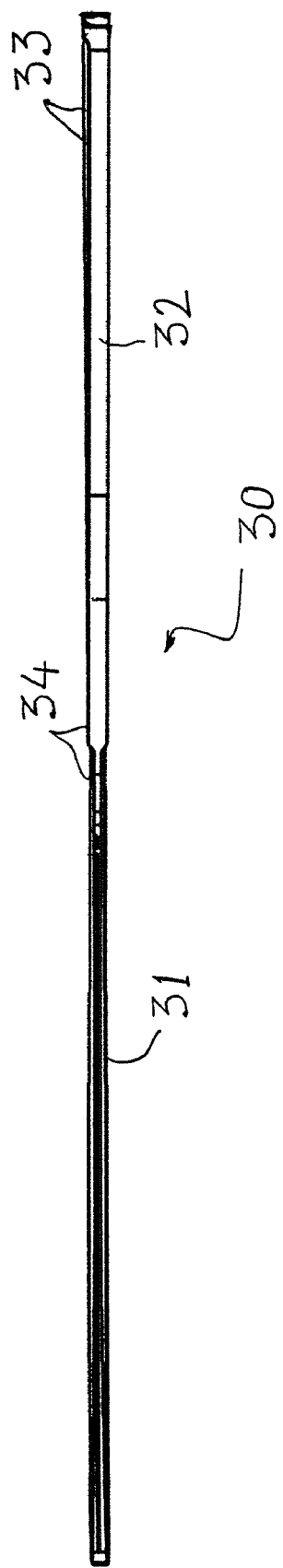
FIG. 3B is a side profile view of a knife with metallic coating in accordance with an embodiment of the invention.

FIGS. 3A and 3B respectively show isometric and side views of a knife represented by reference numeral 30 having its general construction in accordance with the present invention. Knife 30 has a blade portion 31 and a handle portion 32. Knife 30 also contains surface features in the form of flutes or other artistic contours generally denoted by reference numeral 33. A surface-coating layer of metal is deposited on at least one of the surfaces of the plastic knife to impart the appearance of a metallic cutlery piece. In yet another embodiment of the invention the metallic coating is applied to only one of the sides of the knife. The metallic coating on the plastic surface of the knife is denoted by reference numeral 34.

Figure 4:
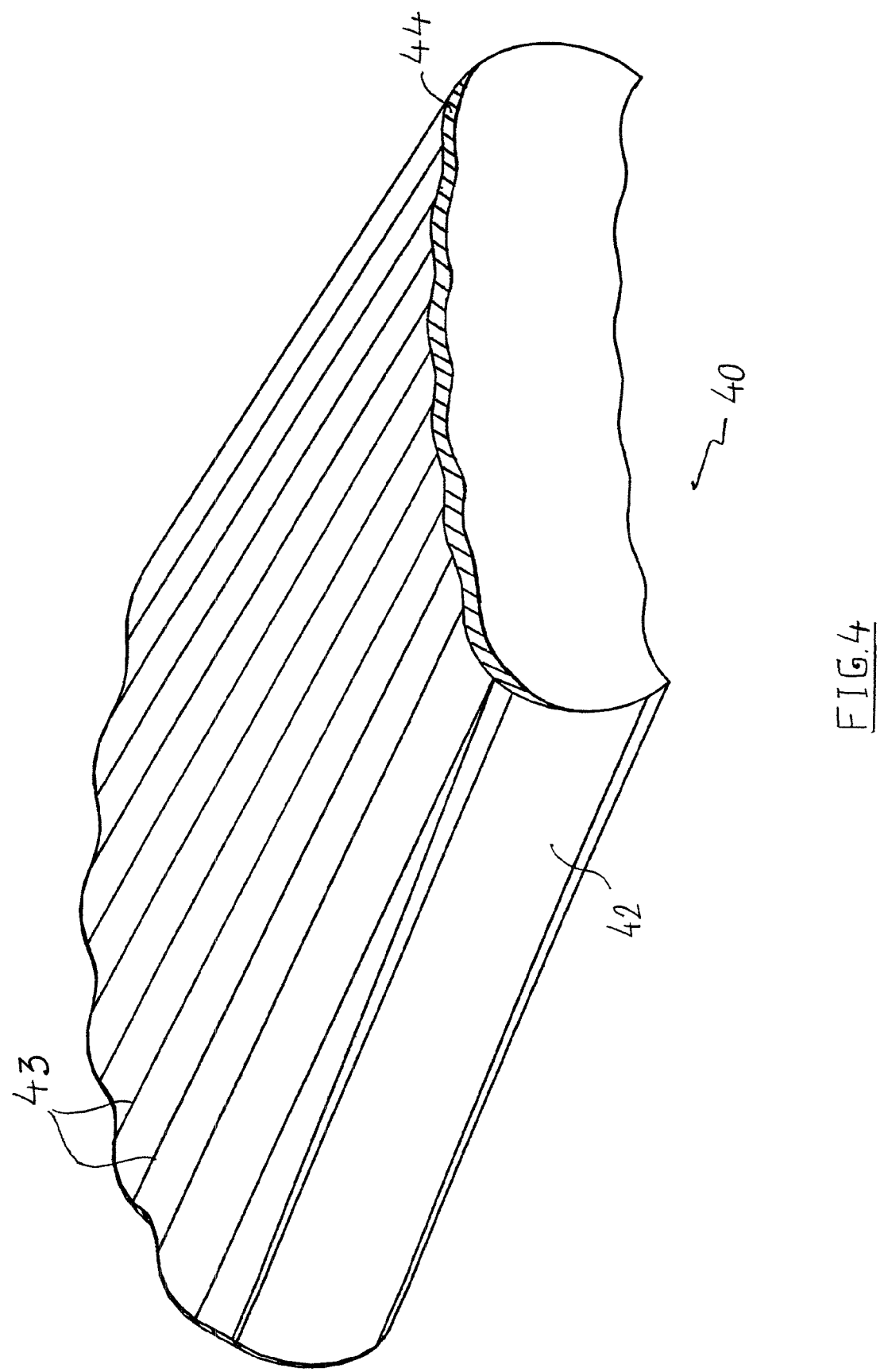
FIG. 4 is a cross-sectional view of a typical cutlery item exhibiting a metallic coating in accordance with an embodiment of the invention.

Referring now to FIG. 4 there is shown a rear cross-section of a typical cutlery item 40. The stem portion of the cutlery item 40 is denoted by reference numeral 42. In the described embodiment the stem 42 has various curved and flute-like features on its surface denoted by reference numeral 43. The cutlery item has a metallic coating applied on one of its surfaces shown in the cross-sectional view by reference numeral 44. The metallic coating 44 is very thin in relation to the bulk of the article (not shown to scale) and follows the contours on the surface of the part. The thickness of the metallic coating can vary depending upon the particular application and in certain embodiments is less than 3,000 nanometers. In further embodiments of the invention the thickness of the metallic coating is less than 1,000 nanometers. It would be readily apparent to those skilled in the art that due to the metal weight, cost, and coating time considerations, a thin metallic layer is commercially desirable. For example, in one embodiment of the invention, the thickness of the metallic coating is less than about 200 nanometers. The thickness of the metal depends upon the properties of the plastic and the metal, with the overall objective of achieving a satisfactory metal-like appearance.

The cutlery items in FIG. 1A through FIG. 3A have been shown as having particular configurations and specific design feature ratios, e.g. fork-tine length to overall fork length, spoon bowl length to overall spoon length, and knife blade length to overall knife length. It will be readily understood by those skilled in the art that these cutlery items are manufactured and marketed in a variety of geometrical configurations, feature ratios and sizes. The physical configurations and design features and aspect ratios exhibited here are done for the purpose of illustration and not by way of limitation. Furthermore, various patterns and ornamental features as are known in the art can adorn the stem, and the present invention is applicable to any such designs.

Referring now to FIG. 5, there is shown an isometric perspective view of a knife represented by reference numeral 50 having its general construction in accordance with an exemplary embodiment of the present invention. Knife 50 has a first portion 50A and a second portion 50B. According to this embodiment the first portion 50A of the knife 50 is metallized while the second portion 50B retains its as-molded appearance. The first and second portions of the knife 50 may be further adapted to have different physical characteristics. Alternatively, the first and second portions may be adapted to coincide with distinct physical or functional sections of the article. As shown in FIG. 5, first portion 50A is adapted to be the blade portion 51, and second portion 50B is adapted to be the handle portion 52 of knife 50. It will be recognized by those of ordinary skill that the first and second portions, shown herein, are exemplary divisions of the article and will not always necessarily refer to or coincide with specific physical, geometrical, or functional features of an article. The blade portion 51 contains a plurality of serrations 53. The handle portion 52 contains a plurality of surface features or patterns generically denoted by reference numeral 53. A surface-coating layer of metal is deposited on at least one of the surfaces of the blade portion 51 to impart the appearance of a metallic cutlery piece. The metallic coating on the blade portion 51 of the plastic surface of the knife is denoted by reference numeral 55. The handle portion 52 of knife 50 is not coated with a metallic layer and retains the basic initial appearance of the plastic surface. Thus, the blade portion 51 displays a metallic appearance while handle portion displays a non-metallic appearance.

According to a variant of the embodiment of the invention, shown in FIG. 5, the metallic coating 55 is applied to only the display side of the knife and wherein the blade portion 51 is constructed from a light transmitting plastic resin while the handle portion 52 is constructed from a colored plastic resin.

Metal coating on the cutlery items can be applied by any of the known vacuum deposition procedures or techniques. Vacuum metallization or deposition is the deposition of a film or coating in a vacuum or low-pressure plasma environment. The term plasma generally refers to an ion- or electron-rich gaseous environment for providing appreciable electrical conductivity. Vacuum deposition is a term that is applied to processes that deposit atoms or molecules one at a time, such as in physical vapor deposition (PVD) or low-pressure chemical vapor deposition (LPCVD).

Typical PVD techniques can be used for accomplishing the objectives of the current invention. In Physical vapor deposition or (PVD) processes metallic particles are vaporized from a solid or liquid source and transported as vapor through vacuum or low-pressure gaseous or plasma environment. The vaporized material can be an element, alloy or compound. The condensation of the particles produces a thin-metallic coating or film on the substrate surface and imparts a metallic look to the substrate. Various variants of the PVD processes have been described in the art, including Vacuum Evaporation, Sputter Deposition or Sputtering, Arc Vapor Deposition and Ion Plating. Additional Evaporation techniques include Filament Evaporation, Flash Evaporation, and Electron-beam Evaporation.

Deposited film or coating thickness typically obtained by PVD processes ranges from few nanometers to thousands of nanometers. PVD processes can be used to form thick deposits through multilayer coatings that can be imparted in a series of steps. Very thick coatings are generally not commercially desirable due to higher costs associated with increasing amounts of coating material needed for thick coatings, and longer processing times required for deposition thereof. Furthermore, extended deposition times may cause over heating and thermal distortion of the plastic article being coated. As would be realized by those of ordinary skill, metal coating thickness deposited on a commercial article becomes a practical and economic decision as long as the aesthetic appearance is satisfied. According to an embodiment of the present invention, the metallic coating on the surface of the articles is generally less than 3000 nanometers (nm) and in a further embodiment of the invention is less than 1000 nm. In yet another embodiment of the invention the metallic coating is less than 200 nm in thickness. And in yet an even further embodiment, the metallic coating is at least 30 nm.

To summarize, according to some of the embodiment of the present invention: (1) the cutlery articles are made of a light-transmitting grade of a thermoplastic resin material; (2) the thermoplastic resin is substantially free of mineral oil and other volatile additives; (3) the metallic coating is applied by a physical vapor deposition (PVD) process; (4) the metallic coating is applied to only one side of the cutlery articles; (5) the metallic coating is of the same composition as the stainless steel alloy used in permanent flatware; and (6) The metallic coating thickness is less than 200 nanometers but greater than about 30 nm.

In one embodiment of the present invention the metallic coating is applied to the plastic cutlery items molded from polystyrene by sputtering vacuum deposition process (also referred to as sputter deposition or sputtering) on only the display side of the plastic cutlery items.

Sputtering or sputter deposition is a PVD coating process which is conducted in an evacuable coating or sputtering chamber. The source of the coating material, the target, is mounted opposite to the substrate items in the sputtering chamber which is then evacuated to a base pressure which typically ranges from $10^{-5}$ to $10^{-10}$ Torr (1 Torr=1 mm Hg) depending upon the process or application. Thereafter, the evacuated coating chamber is backfilled with a continuous flow of an inert gas such as Argon to a pressure of 1 to 100 mTorr (1 mTorr=0.001 Torr=0.001 mm Hg) to create a gas plasma or glow discharge between the metal target and the item or substrate to be coated. A negative DC or RF voltage is applied to the metal sputtering target (metal source) in order to initiate positive-ion bombardment. Positively charged gas ions, generated in the plasma region, are propelled at high velocities towards the target (negative potential), resulting in the ejection of atomic size particles of the metal target (source material) that are directed towards the substrate. Thus, Sputtering is a non-thermal vaporization process where surface atoms are physically ejected from the metal source or target by momentum transfer or exchange from an energetic bombarding particle or gaseous ion accelerated from the plasma. A particular advantage of the sputtering technique is the ability for depositing metals as well as metal alloys and is well suited for depositing stainless steel alloy compositions of the type typically employed for making traditional metal cutlery.

Generally, the metallic coating deposited on the articles displays the characteristic color of the metal source. However, tints can be incorporated in the metal source or the base metal or by using an appropriate reactive gas during the deposition process for imparting a tinted reflective appearance to the plastic articles.

In testing of one of the embodiments, commercial plastic cutlery pieces in the form of a fork, spoon and knife made from either polystyrene or polypropylene were introduced into a lab-size sputtering chamber. The sputtering equipment was provided by Soleras, Inc. A stainless steel target was mounted in the sputtering chamber. The particular composition of stainless steel was 304. The chamber was then pumped down until a vacuum was reached in the range around $10^{-3}$ mm Hg. Argon was supplied to the chamber to generate the plasma. A negative voltage in the range of 5 to 10 kW was applied to the cathode in the evacuated chamber. The coating operation at this setting was continued for about 1 to 5 seconds. Following coating, the power was turned off and vacuum was then released allowing the pressure in the chamber to rise to atmospheric pressure. Thereafter, the chamber was opened and parts were removed from the chamber and examined. Various tests were conducted on the plastic cutlery items for peel-off adhesion. In some trials, coating was applied to both sides of a part. In other iterations it was applied to only one side of the part.

It was found that polystyrene cutlery exhibits much better coating adhesion compared to polypropylene cutlery. In this particular test example—power setting of 7.5 kW and 3-second sputtering time were deemed to be the optimum conditions for good adhesion, surface appearance and uniformity of coating. The most remarkable finding from this experimental work was that the coating could be applied to just one side of the clear polystyrene part to obtain the desired metallic look or effect. This unexpected result reduces manufacturing time and the complexity of manufacturing while at the same time providing twice the utilization of the metal target. Thus, one sided coating was obtained by presenting only the display side of the plastic article to the metal source or target while the underside of the plastic article was facing away from the metal source and was not directly presented to the metal source. Coating on both sides would have required presenting both the display side and the underside to the metal source and would have required two separate metallizing operations.

For a given hardware and power setting configuration, the metal deposition or the thickness of the metal layer is proportional to the duration of sputtering. When a clear or transparent article is subjected to sputter vapor deposition or sputtering for very short durations (typically less than 1 second) the resulting metal-layer is also very thin and merely imparts a hue to the article. The article as a result is not very reflective and practically retains its light-transmitting character. An increase in the duration of sputtering (sputter time) results in a corresponding increase in the metal-layer thickness and the reflectance of the article and a corresponding reduction in the light-transmission.

A useful tool for monitoring the thickness of the metal layer applied to a clear article is an optical densitometer which measures optical density of the article.

Optical density is represented by the following equation:

$$OD=\log_{10}(1/T) \quad (1)$$

Where OD is optical density, and T is Transmittance
Transmittance, T is defined by the following equation:

$$T=I/I_o \quad (2)$$

Where, I is the intensity of transmitted light, and $I_o$ is intensity of incident light.

Thus, for a completely transparent material or article, the optical density is 0 ($\log_{10}1=0$), since transmittance (the ratio of the intensities of transmitted light to incident light) is 1. It would be appreciated by those skilled in the art that increasing the amount of coating or deposition time would result in a corresponding reduction in the intensity of transmitted light and therefore a corresponding reduction in transmittance and an increase in optical density. However, after a certain point, increasing the amount of deposited metal will only bring marginal improvements in optical density due to the logarithmic relationship between optical density and transmittance. For an article having a transmittance of 0.1 or transmitting 10% of incident light the optical density is 1.0 ($\log_{10}10=1$). For an article having a transmittance of 0.01 or transmitting 1% of incident light the optical density is 2.0 ($\log_{10}100=2$). Similarly, for an article having a transmittance of 0.001 or transmitting 0.1% of incident light the optical density is 3.0 ($\log_{10}1000=3$).

Typical cutlery articles molded from clear polystyrene resin according to an embodiment of the current invention have an "initial optical density" of between 0 and 0.3. The term "initial optical density" as used herein refers to the "optical density prior to metallization". Once again, optical density for the clear articles is dependent on the nature of the molded surface, the thickness of the plastic article and the presence of any surface features on the article. As these clear articles are vacuum-metallized, they exhibit increasing optical densities in proportion to the duration of metallizing and/ or the thickness of the metallic coating. At optical density values of less than about 0.5, the overall appearance of the articles is generally considered unacceptable due to the lack of sufficient aesthetic appeal and poor reflectivity. At optical density values above 0.5, the articles have a fair degree of reflectivity and deemed suitable for certain events.

As the optical density of the article is increased from 0.5 to 0.8, a general increase in reflectance is observed, although the metal layer still tends to be very thin. As optical density of the article in increased above 0.8 the articles begins to exhibit sufficient opacity and a more attractive metallic appearance. At about the 1.5 optical density level, the metallized parts have sufficient opacity or reflective properties and are generally considered acceptable according to an embodiment of the invention. In another embodiment of the invention the optical density of the metallized parts is below 2.0. In still another embodiment of the invention the optical density of the metallized parts is below 3.0. As should be readily apparent, an increase in optical density can be readily attained by increased metal deposition or longer sputter time. It will be appreciated by those of ordinary skill that the optimal metal layer thickness or optical density is reached when the article has acquired an attractive reflective appearance and opacity for commercial acceptance. Once this optimal state is reached enhancing optical density or increasing metal thickness beyond the optimal state will not be economically beneficial. Once again the determination of appropriate optical density (or metal thickness) versus appearance is influenced by economics, with a minimum optical density being about 0.5 on the lower end. Although optical density values of about 5.5 are obtainable with vacuum metallizing processes on clear parts, optical density values of above 1.5 are typically deemed acceptable for the purpose of metallized plastic cutlery.

A further method for enhancing optical density without increasing sputter time or metal thickness is to incorporate a light transmitting dye or tint in the base material or resin. Typically grayish tints work well but tints in a variety of colors can be utilized for enhancing the opacity of the cutlery item and imparting other appearance effects. Since the tint itself provides some degree of opacity the thickness of the metallic coating layer thickness can be proportionally reduced to improve the economics of the process. For instance, a clear plastic cutlery article may have an initial optical density (prior to metallization) of 0-0.2; however, the addition of a tint in the base resin can readily increase the initial optical density of the cutlery article by about 0.1 to 0.5, in other words the range of initial optical density of the tinted cutlery article would become 0.1 to 0.7, therefore the amount of metal required to achieve a final desired optical density would be commensurately reduced. According to an embodiment of the invention plastic cutlery having adequate reflective characteristics is produced by incorporating color tints in the base resin and depositing an extremely thin metal layer having a thickness of between 30 nm to 60 nm.

According to another embodiment of the invention the plastic article is molded from a plastic resin with two distinct portions—a first portion and a second portion; and, wherein the first portion is rendered clear or is tinted by using a light transmitting tint added to the plastic resin, and the second portion is colored with an opaque colorant incorporated into said plastic resin, and wherein only the first portion of the plastic article is metallized by a thin metallic coating.

Contact by the metallized cutlery with various foods could affect the coating or cause peel-off, therefore the metallized cutlery was subjected to confirmatory tests in a variety of food environments. Tests included subjecting metallized cutlery to boiling water, boiling tomato sauce, boiling water-vinegar mixture, lemon juice, coffee, ice, thermal cycles with alternate exposure to boiling water and ice-cold water, and shipping bulk cutlery across the country. It must be noted that the coated cutlery is susceptible to scratches due to abrasion as any ordinary metal cutlery.

It would be appreciated by those skilled in the art that a prerequisite for practical use and commercial acceptance of metallized plastic cutlery is that the metallic coating layer should exhibit sufficient adhesion to the plastic material and reasonable abrasion resistance for utilization as a food implement. Tape peel tests are normally used for testing the adhesion between the cutlery item surface and the metal layer deposited thereon. Adhesion is also related to abrasion resistance or durability of the coating. Adhesion and abrasion resistance of the deposited metal layer to the substrate surface can be enhanced by a variety of methods.

As indicated earlier, the adhesion between the plastic substrate or the plastic article and the deposited metal layer can be enhanced by utilizing a volatiles free resin completely free of mineral oil and other lubricants. Another way to improve adhesion and abrasion resistance of the metallic coating it to pre-treat the surface of the plastic part by either flame treatment, plasma treatment or corona treatment for increasing the surface energy of the cutlery item. Surface treatments for enhancing the surface energy of plastic parts are well known in the art. For example, a typical corona treatment can enhance the surface energy of a polystyrene part from 35 dynes to about 46 dynes.

Yet another method for improving abrasion resistance or durability of the metallic coating is to apply a light transmitting heat- or UV-curable coating, which serves to seal-off the deposited metal layer. Such coating compositions are well known in the art and are used to provide a barrier overcoat over a variety of articles including Compact disks and DVDs. FDA approved compositions of hardenable clear coatings, which can be applied by spraying, are also readily available for covering food service articles.

Further improvement in coating strength can be achieved by subjecting a vacuum metallized cutlery article to a secondary Chemical Vapor Deposition (CVD) process for depositing a thin over coating of a substantially clear and abrasion resistant material. For example plasma-enhanced CVD (PECVD) process can be used to deposit thin films of Silicon dioxide or other clear materials.

Another technique for improving adhesion of the metallic coating to the article is by utilizing a mixture of Argon and Nitrogen for plasma generation in the sputtering chamber during metal deposition. The typical concentration of Nitrogen in the Nitrogen and Argon mixture is between 10% and 40%. Sputter deposition conducted with a mixture of Nitrogen and Argon yields a metal layer with enhanced durability compared to Argon plasma alone.

The inventors have discovered that subjecting the metallized plastic cutlery articles to a curing process after metallizing, results in a spontaneous improvement of metal to plastic adhesion as well as the abrasion resistance of the metallic coating. The curing can be accomplished by simply storing the metallized articles in a clean and dry area. The spontaneous improvement in plastic to metal layer adhesion and abrasion characteristics of the metallic layer continues for several days after the parts are vacuum metallized. It is preferable that during the curing process the parts are stored under relatively dry or low-humidity conditions. Appreciable improvement in the adhesion and abrasion characteristics of the metal layer to the plastic article is typically seen within 24 to 72 hours of curing at room temperature after metallizing. In an embodiment of the invention the metallized articles are stored for a period of about 2 weeks prior to commissioning them for use or sale. The term curing period, storing period, holding period, post-metallizing holding period have been used here to connote that the plastic articles are held in a quiescent or undisturbed state after metallizing.

It is also seen that the rate of curing can be accelerated by subjecting the parts to a higher temperature and relatively low humidity environment. Thus, if the parts are heated during the curing or holding period the rate of improvement in both adhesion and abrasion characteristics is faster.

A useful method of manufacture of metallized plastic cutlery and other tableware according to the present invention is as follows:

Step 1: Molding plastic cutlery using traditional injection molding techniques.

Step 2: Taking out the plastic cutlery from the mold using a part take-out device such as a side-entry or top-entry robot.

Step 3: Placing the individual pieces of cutlery in a non-contiguous manner on transferring or conveying means wherefrom cutlery parts are transferred to a vacuum depositing station. Cutlery pieces are maintained in an individualized or non-contiguous manner to prevent surface masking by adjacent cutlery pieces during metallizing or coating.

Step 4: Subjecting plastic cutlery to a vacuum deposition process.

Step 5: Collecting plastic cutlery that has been metallized and subjecting it to a curing process for enhancing packing them into suitable packaging containers for shipping.

Step 6: Holding the packaged container in a clean and dry area for a predetermined post-metallizing holding period prior to committing metallized plastic cutlery for use or sale.

The predetermined post-metallizing holding period in step 6 can be as long as 45 days. In one embodiment of the invention the holding period is about 2 weeks. Step 6 can be conducted either at room temperature, or at a single elevated temperature, or at plurality of temperatures during the curing period. In one embodiment of the invention the curing for metallized articles is conducted at room temperature for about two weeks. According to another embodiment of the invention the metallized articles are subjected to curing at a temperature of up to 150 degrees Fahrenheit for about 1 to 3 hours.

Although, this invention has been described particularly in relation to metallizing plastic cutlery, it will be recognized that it is applicable to general food service items, tableware and other industries wherein it is desired to impart metallic coating onto plastic and non-plastic parts. Also, it would be realized by those skilled in the art that various modifications, alterations and adaptations can be made to this invention without departing from the spirit and scope of this invention.

Numerous characteristics and advantages have been set forth in the foregoing description, together with details of structures and functions of the present invention, and some of the novel features thereof are pointed out in appended claims. The disclosure, however, is illustrative only, and change may be made in arrangement and details, within the principle of the invention, to the full extent indicated by the broad general meaning of the terms in which the appended claims are expressed.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A metallized plastic food service item, comprising:
a plastic cutlery article for handling and consuming food, said plastic cutlery article having a display surface and an underside, said plastic cutlery article being adapted for placement on a table surface in a traditional table-setting presentation with said underside facing down towards said table surface and said display surface facing upwards; and
a thin metallic coating deposited on said display surface of said plastic cutlery article, wherein said thin metallic coating is characterized by its suitability for food contact without an overcoat, and wherein said thin metallic coating is of a sufficient thickness to impart a reflective metal appearance to the plastic cutlery article, to simulate genuine metal cutlery, said thickness being less than about 2000 nanometers and wherein said thin metallic coating is deposited by a sputter deposition process.

2. The metallized plastic food service item according to claim 1, wherein said thin metallic coating is less than 1000 nanometers in thickness.

3. The metallized plastic food service item according to claim 1, wherein said thin metallic coating is less than 200 nanometers in thickness.

4. The metallized plastic food service item according to claim 1, wherein said plastic cutlery article is selected from a group consisting of fork, knife and spoon.

5. The metallized plastic food service item according to claim 1, wherein said plastic cutlery article is selected from a group consisting of forks, knives, spoons, serving utensils and combinations thereof.

6. The metallized plastic food service item according to claim 1, further comprising an overcoat on said thin metallic coating.

7. The metallized plastic food service item according to claim 1, wherein said plastic cutlery article is adapted for disposable use.

8. The metallized plastic food service item according to claim 1, wherein said plastic cutlery article is injection molded from a plastic resin.

9. The metallized plastic food service item according to claim 1, wherein said underside is characterized by absence of said thin metallic coating.

10. The metallized plastic food service item according to claim 1, wherein said plastic cutlery article is molded from a plastic material which is light-transmitting.

11. The metallized plastic food service item according to claim 1, wherein said plastic cutlery article is molded from a plastic material with a color tint.

12. The metallized plastic food service item according to claim 1, wherein said metallized plastic food service item has an optical density of greater than 1.0.

13. The metallized food service item according to claim 1, wherein approximately all of said plastic cutlery article is coated with said thin metallic coating.

14. The metallized food service item according to claim 1, wherein said thin metallic coating is deposited on only a portion of said plastic cutlery article.

15. The metallized plastic food service item according to claim 1, wherein said plastic cutlery article is obtained from a plastic resin composition which is substantially free of mineral oil and wax.

16. The metallized plastic food service item according to claim 1, further comprising cosmetic surface features for enhancing the reflective metal appearance of said plastic cutlery article.

17. The metallized plastic food service item according to claim 1, wherein said plastic cutlery article is substantially composed of polystyrene.

18. A cutlery article for handling and consuming food, comprising a plastic material and having a plurality of surfaces, wherein at least one surface amongst said plurality of surfaces is deposited with a thin metal layer; said thin metal layer being suitable for food contact without an overcoat and having sufficient durability for handling and consuming food; said thin metal layer being deposited by a sputter deposition process, whereby a reflective metal appearance which simulates genuine metal cutlery is imparted to at least a portion of said cutlery article, and said thin metal layer being less than about 2000 nanometers in thickness.

19. A cutlery article according to claim 18, wherein said plastic material is light transmitting.

20. A cutlery article according to claim 18, wherein said cutlery article is injection molded from a polystyrene resin.

21. A cutlery article according to claim 18, wherein said thin metal layer is less than 1000 nanometers in thickness.

22. A cutlery article according to claim 18, wherein said thin metal layer is less than 200 nanometers in thickness.

23. A cutlery article according to claim 18, further comprising a thin overcoat of a curable clear coting on said thin metal layer.

24. A cutlery article according to claim 18, wherein approximately all of said cutlery article is coated with said thin metal layer.

25. A cutlery article according to claim 18, wherein said plastic material includes a color tint.

26. A cutlery article according to claim 18, wherein said cutlery article has an optical density of greater than 1.0.

27. A metallized food service item for handling and consuming food, comprising:
a plastic cutlery article having a plurality of surfaces, wherein at least one surface amongst said plurality of surfaces is deposited with a thin metallic coating,
said thin metallic coating being deposited by a sputter deposition process and being characterized by absence of an overcoat on said thin metallic coating;
said thin metallic coating being of a sufficient thickness to impart a reflective metal appearance to at least a portion of said plastic cutlery article; and
said thin metallic coating being less than 1000 nanometers in thickness.

28. A metallized food service item according to claim 27, wherein said plastic cutlery article is injection molded from a polystyrene resin.

29. A metallized food service item according to claim 27, wherein said thin metallic coating is less than 200 nanometers in thickness.

30. A metallized food service item according to claim 27, wherein approximately all of said plastic cutlery article is coated with said thin metallic coating.

31. A metallized food service item according to claim 27, wherein said plastic cutlery article is molded from a plastic material with a color tint.

32. A metallized food service item according to claim 27, wherein said metallized food service item has an optical density of greater than 1.0.

33. A metallized food service item according to claim 27, wherein said plastic cutlery article is at least one of a fork, a knife and a spoon.

34. A metallized food service item for handling and consuming food, comprising:
a plastic cutlery article having a plurality of surfaces, wherein at least one surface amongst said plurality of surfaces is deposited with a thin metallic coating without an overcoat;
said thin metallic coating being of a sufficient thickness to impart a reflective metal appearance to said plastic cutlery article;
said thickness being less than 1000 nanometers; and
said thin metallic coating being deposited by a sputter deposition process.

35. A metallized food service item according to claim 34, wherein said plastic cutlery article is injection molded from a polystyrene resin.

36. A metallized food service item according to claim 34, wherein said thin metallic coating is less than 200 nanometers in thickness.

37. A metallized food service item according to claim 34, wherein approximately all of said plastic cutlery article is coated with said thin metallic coating.

38. A metallized food service item according to claim 34, wherein said plastic cutlery article is molded from a plastic material with a color tint.

39. A metallized plastic food service item according to claim 34, wherein said metallized food service item has an optical density of greater than 1.0.

* * * * *